United States Patent
Oh et al.

(10) Patent No.: US 10,789,172 B2
(45) Date of Patent: Sep. 29, 2020

(54) MEMORY DEVICE

(71) Applicant: SK hynix Inc., Gyeonggi-do (KR)

(72) Inventors: Sung-Lae Oh, Chungcheongbuk-do (KR); Dong-Hyuk Kim, Seoul (KR); Soo-Nam Jung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 45 days.

(21) Appl. No.: 16/209,174

(22) Filed: Dec. 4, 2018

(65) Prior Publication Data

US 2020/0019508 A1 Jan. 16, 2020

(30) Foreign Application Priority Data

Jul. 13, 2018 (KR) .......................... 10-2018-0081459

(51) Int. Cl.
| | |
|---|---|
| *G11C 16/10* | (2006.01) |
| *G06F 12/0882* | (2016.01) |
| *G06F 12/02* | (2006.01) |
| *G11C 16/08* | (2006.01) |
| *G11C 16/26* | (2006.01) |
| *G11C 7/10* | (2006.01) |
| *G11C 16/24* | (2006.01) |

(52) U.S. Cl.
CPC ...... *G06F 12/0882* (2013.01); *G06F 12/0246* (2013.01); *G11C 7/1057* (2013.01); *G11C 7/1084* (2013.01); *G11C 16/08* (2013.01); *G11C 16/10* (2013.01); *G11C 16/24* (2013.01); *G11C 16/26* (2013.01); *G06F 2212/7201* (2013.01); *G06F 2212/7203* (2013.01)

(58) Field of Classification Search
CPC .................................. G11C 7/22; G11C 16/10
USPC ........................................ 365/185.22, 189.05
See application file for complete search history.

(56) References Cited

U.S. PATENT DOCUMENTS

| | | | | |
|---|---|---|---|---|
| 6,574,720 | B1* | 6/2003 | Hopeman | G06F 12/084 707/999.202 |
| 8,189,383 | B2* | 5/2012 | Yang | G11C 11/5628 365/185.03 |
| 8,234,440 | B2* | 7/2012 | Chae | G06F 12/0246 711/103 |
| 8,347,042 | B2* | 1/2013 | You | G11C 16/26 365/185.18 |
| 9,601,211 | B1* | 3/2017 | Yang | G06F 13/4022 |
| 10,324,629 | B2* | 6/2019 | Lee | G11C 16/0483 |
| 2004/0174727 | A1* | 9/2004 | Park | G11C 16/26 365/100 |
| 2006/0050314 | A1* | 3/2006 | Shiga | G11C 16/102 358/1.16 |

(Continued)

FOREIGN PATENT DOCUMENTS

| | | |
|---|---|---|
| JP | 3850791 | 11/2006 |
| KR | 1020170130969 | 11/2017 |

*Primary Examiner* — Michael T Tran
(74) *Attorney, Agent, or Firm* — IP & T Group LLP

(57) ABSTRACT

A memory device includes a plurality of bit lines extending in a first direction and arranged in a second direction perpendicular to the first direction; a page buffer circuit including a plurality of page buffers which are electrically coupled to the plurality of bit lines; and a cache circuit including a plurality of caches which are electrically coupled to the plurality of page buffers, wherein the page buffer circuit is divided into a plurality of page buffer regions and is laid out at both sides of the cache circuit in the first direction.

19 Claims, 25 Drawing Sheets

(56) References Cited

U.S. PATENT DOCUMENTS

| | | | |
|---|---|---|---|
| 2006/0203548 A1* | 9/2006 | You | G11C 16/10 365/185.12 |
| 2007/0297236 A1* | 12/2007 | Tokiwa | G11C 16/0483 365/185.22 |
| 2008/0189478 A1* | 8/2008 | Chae | G06F 12/0246 711/103 |
| 2008/0291739 A1* | 11/2008 | Lee | G11C 16/3436 365/185.22 |
| 2010/0329008 A1* | 12/2010 | Cho | G11C 16/10 365/185.05 |
| 2010/0329030 A1* | 12/2010 | You | G11C 16/10 365/185.22 |
| 2012/0008385 A1* | 1/2012 | Yoo | G11C 16/10 365/185.2 |
| 2012/0008418 A1* | 1/2012 | Huh | G11C 16/26 365/185.25 |
| 2012/0127802 A1* | 5/2012 | Choi | G11C 16/0483 365/185.22 |
| 2012/0243342 A1* | 9/2012 | Lee | G11C 16/0483 365/189.05 |
| 2013/0163335 A1* | 6/2013 | Kim | G11C 16/06 365/185.12 |
| 2013/0250683 A1* | 9/2013 | Hosono | G11C 16/0483 365/185.05 |
| 2014/0108725 A1* | 4/2014 | Lee | G11C 29/785 711/114 |
| 2014/0153331 A1* | 6/2014 | Jang | G11C 16/102 365/185.03 |
| 2014/0169098 A1* | 6/2014 | Tanzawa | G11C 16/06 365/185.18 |
| 2015/0055421 A1* | 2/2015 | Lim | G11C 16/26 365/189.05 |
| 2015/0078100 A1* | 3/2015 | Nakayama | G11C 7/1039 365/185.29 |
| 2015/0200015 A1* | 7/2015 | Kim | G11C 7/1042 365/185.12 |
| 2016/0027504 A1* | 1/2016 | Lee | G11C 11/5635 365/185.03 |
| 2016/0103763 A1* | 4/2016 | Chen | G11C 16/10 711/154 |
| 2017/0271019 A1* | 9/2017 | Park | G11C 16/24 |
| 2017/0278580 A1* | 9/2017 | Lim | G11C 16/08 |
| 2018/0136860 A1* | 5/2018 | Lim | G06F 3/065 |
| 2018/0144800 A1* | 5/2018 | Park | G11C 16/08 |
| 2018/0261296 A1* | 9/2018 | Choi | G11C 29/021 |
| 2019/0057751 A1* | 2/2019 | Lee | G11C 16/08 |

* cited by examiner

MEMORY DEVICE

CROSS-REFERENCE TO RELATED APPLICATION

The present application claims priority under 35 U.S.C. 119(a) to Korean Patent Application No. 10-2018-0081459 on Jul. 13, 2018, which is incorporated herein by reference in its entirety.

BACKGROUND

1. Technical Field

Various embodiments of the present invention generally relate to a memory device. Particularly, the embodiments relate to a memory device including page buffers.

2. Related Art

In a volatile memory device, stored data may be lost when power supply is interrupted, but the volatile memory device may have high write and read speeds. On the other hand, in a nonvolatile memory device stored data may be retained even when power supply is interrupted, but the nonvolatile memory device may have relatively low speeds. Therefore, when storing data that needs to be retained regardless of whether power is supplied or not, a nonvolatile memory device may be used. Nonvolatile memory devices include a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), and a ferroelectric RAM (FRAM). Flash memories may be classified into a NOR type and a NAND type.

A NAND flash memory device is widely used as a data storage device among nonvolatile memory devices. The NAND flash memory device may perform operations necessary to read and output the data stored in memory cells, by using a plurality of page buffers.

SUMMARY

In an embodiment, a memory device may include: a plurality of bit lines extending in a first direction and arranged in a second direction perpendicular to the first direction; a page buffer circuit including a plurality of page buffers which are electrically coupled to the plurality of bit lines; and a cache circuit including a plurality of caches which are electrically coupled to the plurality of page buffers, wherein the page buffer circuit is divided into a plurality of page buffer regions and is disposed at both sides of the cache circuit in the first direction.

In an embodiment, a memory device may include: a page buffer circuit including a plurality of page buffers; and a cache circuit including a plurality of caches which correspond to the plurality of page buffers, respectively, wherein each of the plurality of page buffers is coupled to a corresponding cache through a separate page line, and wherein some of page lines which are coupled to page buffers constituting one data input/output unit are laid out at one side of the cache circuit, and the other some of the page lines are laid out at the other side of the cache circuit.

In an embodiment, a memory device may include: a page buffer circuit including a plurality of page buffers; and a cache circuit including a plurality of caches which correspond to the plurality of page buffers, respectively, wherein page buffers constituting one data input/output unit are laid out by being distributed in a plurality of page buffer regions, and page buffers constituting one data input/output unit in each page buffer region are coupled to caches through one page line, and wherein some of page lines which are coupled to the page buffers constituting one data input/output unit are laid out at one side of the cache circuit, and the other some of the page lines are laid out at the other side of the cache circuit.

In an embodiment, a memory device may include: a cache circuit including plurality of caches; and first and second page buffer groups disposed at opposite sides of the cache circuit and each including page buffers respectively coupled to each half of the caches, wherein the caches and the buffers are arranged in a direction of the opposite sides.

DETAILED DESCRIPTION

Figure 1:
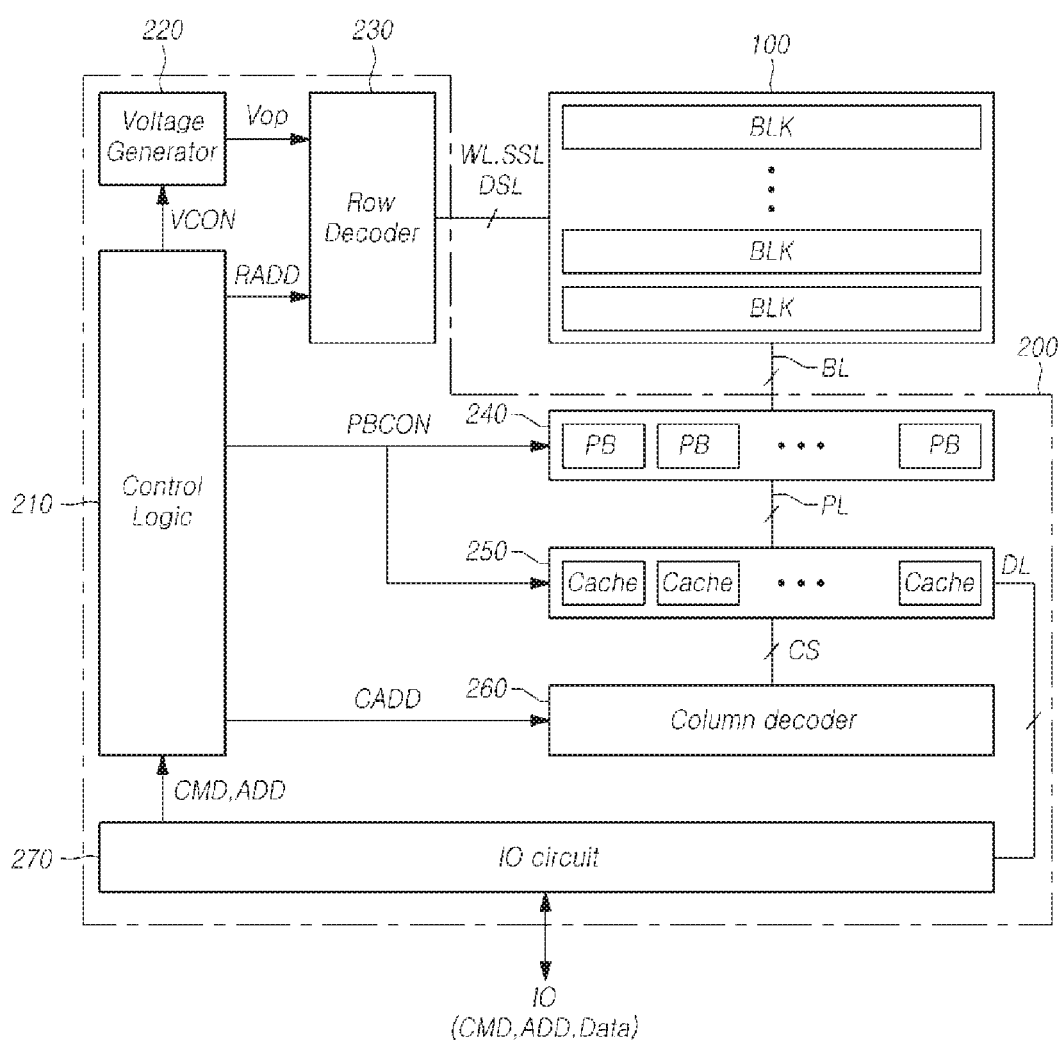
FIG. 1 is a block diagram illustrating an example of a memory device in accordance with an embodiment.

Hereinafter, aspects of the present disclosure will be described in detail with reference to the accompanying drawings. In the following description, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

It is noted that reference to "an embodiment" does not necessarily mean only one embodiment, and different references to "an embodiment" are not necessarily to the same embodiment(s).

It will be understood that, although the terms "first", "second", "third", A, B, (a), (b), and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

FIG. 1 is a block diagram illustrating an example of a memory device in accordance with an embodiment.

Referring to FIG. 1, the memory device in accordance with the embodiment may include a memory cell array 100 and a peripheral circuit 200. The peripheral circuit 200 may include a control logic 210, a voltage generator 220, a row decoder 230, a page buffer circuit 240, a cache circuit 250, a column decoder 260 and an input/output circuit 270.

Figure 2:
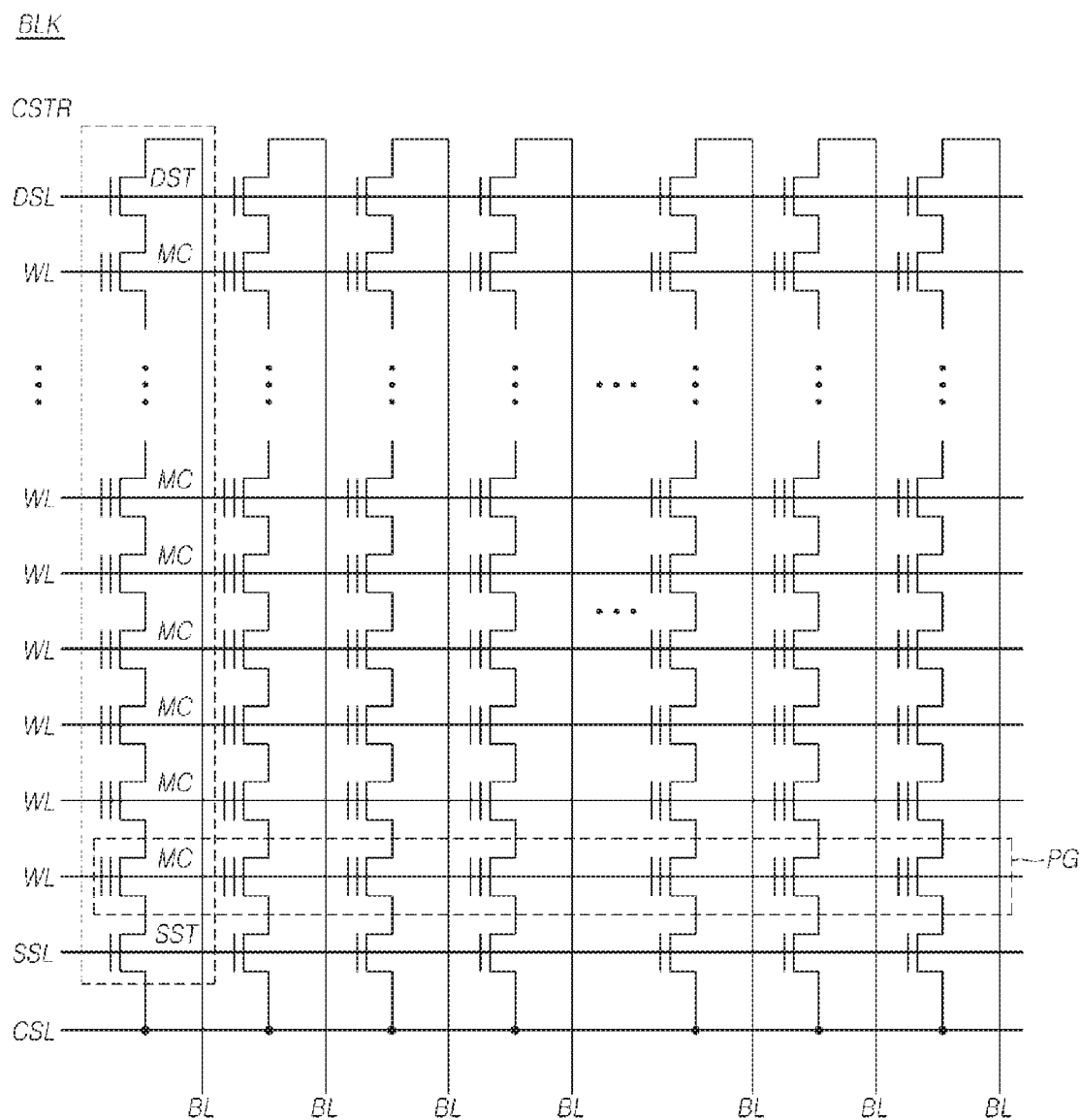
FIG. 2 is a circuit diagram illustrating an example of one memory block among the memory blocks shown in FIG. 1.

The memory cell array 100 may include a plurality of memory cells (shown in FIG. 2). The memory cell array 100 may be configured as a three-dimensional memory array of a type in which the memory cells are stacked in a direction perpendicular to a substrate, but it is to be noted that the present disclosure is not limited thereto.

The memory cell array 100 may be coupled to the row decoder 230 through word lines WL and select lines DSL and SSL. The select lines DSL and SSL may include a drain select line DSL and a source select line SSL. The memory cell array 100 may be coupled to the page buffer circuit 240 through bit lines BL. The memory cell array 100 may store the data inputted through the page buffer circuit 240, in a program operation, and may transfer stored data to the page buffer circuit 240, in a read operation.

The memory cell array 100 may include a plurality of memory blocks BLK. Memory block BLK may be an erase unit. Word lines WL, select lines DSL and SSL and bit lines BL may be coupled to the respective memory blocks BLK. Word lines WL and select lines DSL and SSL may be coupled to each of the memory blocks BLK. Bit lines BL may be coupled in common to a plurality of memory blocks BLK. Descriptions for the memory blocks BLK will be made later with reference to FIG. 2.

The control logic 210 may be configured to output a voltage control signal VCON for generating voltages necessary for the operation of the memory device, in response to a command CMD inputted through the input/output circuit 270. The control logic 210 may be configured to output a page buffer control signal PBCON for controlling the page buffer circuit 240 and the cache circuit 250. The control logic 210 may be configured to output a row address signal RADD and a column address signal CADD in response to an address signal ADD inputted through the input/output circuit 270.

The voltage generator 220 may be configured to generate various operating voltages Vop to be used in a program, read or erase operation, in response to the voltage control signal VCON of the control logic 210. For example, the voltage generator 220 may be configured to generate program voltages, pass voltages, read voltages and erase voltages of various levels, in response to the voltage control signal VCON.

The row decoder 230 may be configured to select one among the memory blocks BLK of the memory cell array 100, in response to the row address signal RADD from the control logic 210. The row decoder 230 may be configured to transfer the operating voltages Vop from the voltage generator 220, to the word lines WL and the select lines DSL and SSL coupled to a selected memory block BLK.

The page buffer circuit 240 may be coupled to the memory cell array 100 through bit lines BL. The page buffer circuit 240 may include a plurality of page buffers PB which are respectively coupled to the bit lines BL. The page buffers PB may exchange data with the memory cell array 100 through the bit lines BL.

The cache circuit 250 may be coupled with the page buffer circuit 240 through page lines PL, and may be coupled with the input/output circuit 270 through data lines DL. The cache circuit 250 may be configured to temporarily store the data received from the memory cell array 100 or data to be provided to the memory cell array 100. The cache circuit 250 may be configured to store the data received from the respective page buffers PB and transfer some of the stored data to the input/output circuit 270 through the data lines DL in response to a column select signal CS inputted from the column decoder 260. The cache circuit 250 may be configured to operate in response to the page buffer control signal PBCON received from the control logic 210.

While it is illustrated in FIG. 1 that the cache circuit 250 configures a separate block from the page buffer circuit 240, it may be understood that the cache circuit 250 configures a page buffer section together with the page buffer circuit 240. In this specification, the cache circuit 250 will illustrated as a separate block from the page buffer circuit 240 for the sake of convenience in explanation, and the name thereof will also be described separately.

The column decoder 260 may be configured to generate the column select signal CS in response to the column address signal CADD received from the control logic 210.

For instance, the column decoder 260 may generate the column select signal CS corresponding to the column address signal CADD such that some data selected by the column address signal CADD among the data of the respective page buffers PB may be transferred to the input/output circuit 270 via the cache circuit 250.

The input/output circuit 270 may be configured to transfer the command CMD or the address ADD inputted from an outside, to the control logic 210, or exchange data Data with the page buffers PB through the cache circuit 250. The input/output circuit 270 may include a plurality of input/output sense amplifiers which generate data by amplifying the voltages of the data lines DL and output the generated data to an input/output path IO.

The input/output path IO may include 2^N (N is a natural number of 2 or more) number of data input/output pins. For example, N may be 3, that is, the input/output path IO may include eight data input/output pins which may be represented by IO<0> to IO<7>. In the example where eight data input/output pins are used, the cache circuit 250 may transfer eight data selected among the data received from the page buffers PB, to the input/output circuit 270 through the data lines DL. The input/output circuit 270 may amplify the eight data received from the cache circuit 250, through sense amplifiers, and may provide the amplified data to the data input/output pins.

The peripheral circuit 200 may include the control logic 210, the voltage generator 220, the row decoder 230, the page buffer circuit 240, the cache circuit 250, the column decoder 260 and the input/output circuit 270. The entire or partial configuration of the peripheral circuit 200 may be laid out under the memory cell array 100. Such a structure is referred to as a PUC (peripheral circuit under cell) or a COP (cell on peripheral circuit). The memory device according to the embodiment of the present disclosure may also be applied to the PUC or COP structure.

FIG. 2 is a circuit diagram illustrating an example of one memory block BLK among the memory blocks shown in FIG. 1.

Referring to FIG. 2, the memory block BLK may include a plurality of cell strings CSTR which are coupled between the plurality of bit lines BL and a common source line CSL.

Each of the cell strings CSTR may be coupled between a corresponding bit line BL and the common source line CSL. Each of the cell strings CSTR may include a source select transistor SST which is coupled to the common source line CSL, a drain select transistor DST which is coupled to the bit line BL, and a plurality of memory cells MC which are coupled between the source select transistor SST and the drain select transistor DST. The gate of the source select transistor SST may be coupled to a source select line SSL. The gates of the memory cells MC may be coupled to corresponding word lines WL, respectively. The gate of the drain select transistor DST may be coupled to a drain select line DSL.

The source select line SSL, the word lines WL and the drain select line DSL may be laid out in a direction perpendicular to the bit lines BL. The source select line SSL, the word lines WL and the drain select line DSL may form a three-dimensional structure by being stacked in a vertical direction on the surface of the substrate.

The memory cells MC included in the memory block BLK may be divided into physical page units or logical page units. For example, memory cells MC which share one word line WL and are coupled to different cell strings CSTR may configure one physical page PG. Such a page may be the basic unit of a read operation.

While it is illustrated in FIG. 2 that one drain select transistor DST and one source select transistor SST are provided in each of the cell strings CSTR it is to be noted that at least two drain select transistors or at least two source select transistors may be provided in each of the cell strings CSTR.

Figure 3:
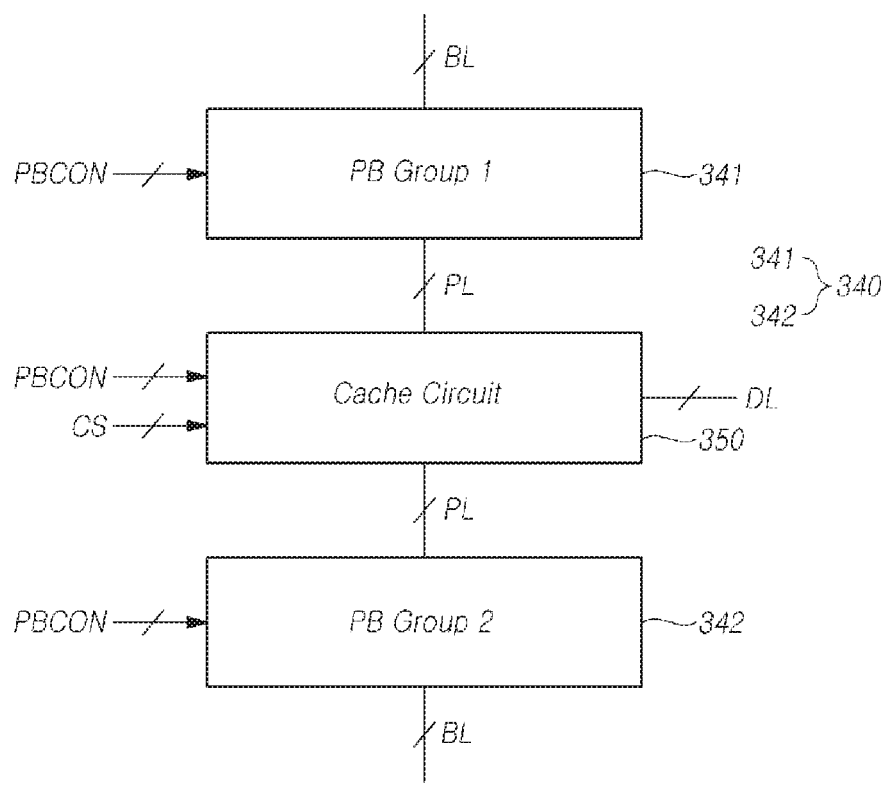
FIG. 3 is a block diagram illustrating an example of the structure of a page buffer circuit and a cache circuit in accordance with an embodiment.

FIG. 3 is a block diagram illustrating an example of the structure of a page buffer circuit and a cache circuit in accordance with an embodiment.

Referring to FIG. 3, a page buffer circuit 340 may be divided into a first page buffer group 341 and a second page buffer group 342 and be disposed at both sides of a cache circuit 350. That is, the page buffer circuit 340 may be divided into a plurality of page buffer groups.

The first page buffer group 341 and the second page buffer group 342 may be coupled to bit lines BL to obtain information on the states of a memory cell array. The first page buffer group 341 and the second page buffer group 342 may transfer and receive data to and from the cache circuit 350 through page lines PL. The operations of the first page buffer group 341 and the second page buffer group 342 may be controlled by the page buffer control signal PBCON.

The cache circuit 350 may transfer and receive data to and from the first page buffer group 341 and the second page buffer group 342 through the page lines PL, and may transfer and receive data to and from an input/output circuit 270 through data lines DL. The operation of the cache circuit 350 may be controlled by the page buffer control signal PBCON and the column select signal CS.

Figure 4:
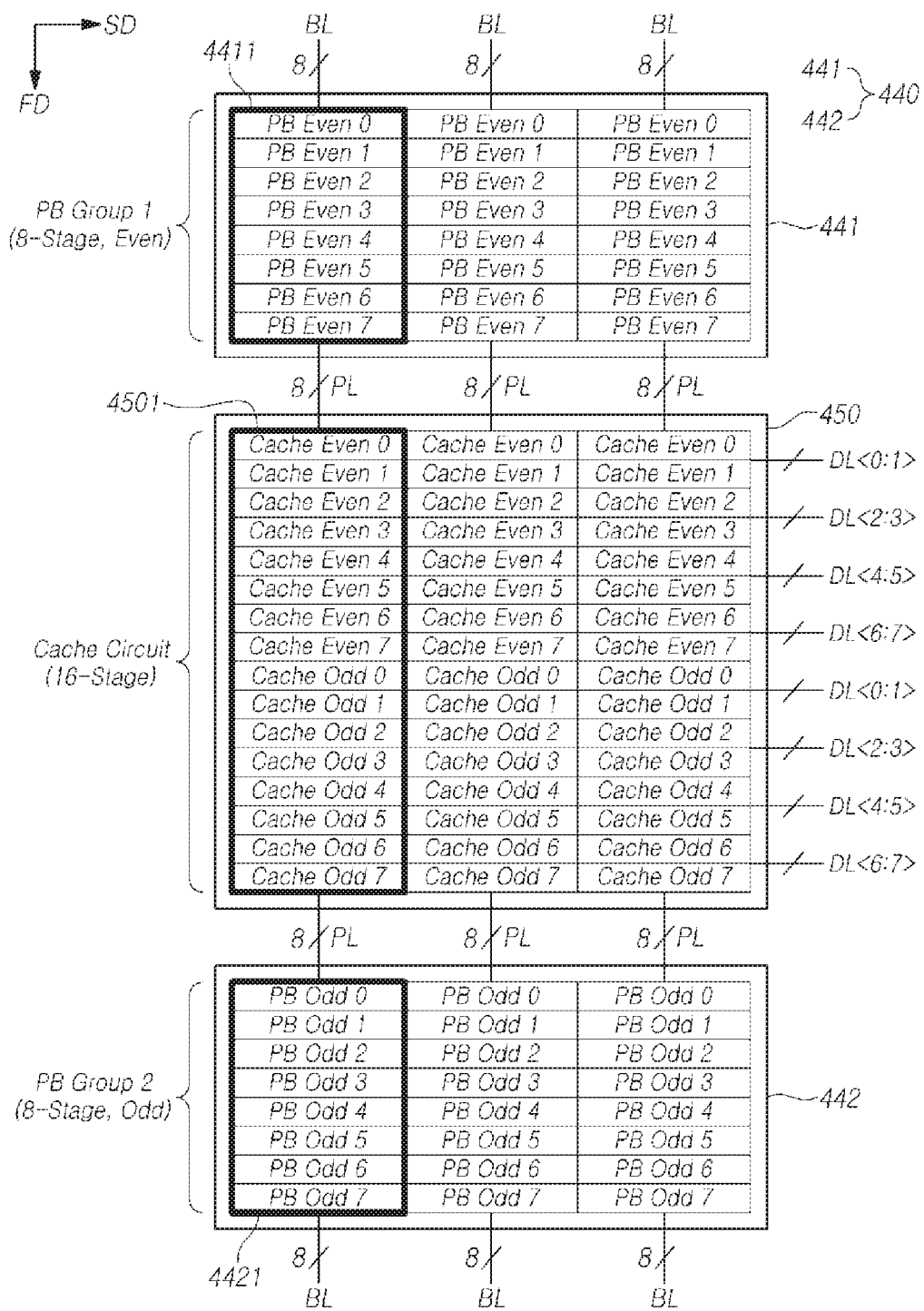
FIGS. 4 and 5 are diagrams illustrating examples of the internal layouts of the page buffer circuit and the cache circuit of FIG. 3.

FIG. 4 is a diagram illustrating an example of the internal layout of the page buffer circuit 340 and the cache circuit 350 of FIG. 3.

Referring to FIG. 4, a page buffer circuit 440 may be divided into a first page buffer group 441 and a second page buffer group 442 and be laid out at both sides of a cache circuit 450.

The first page buffer group 441 may include a plurality of even page buffers PB Even which are arranged in the form of a matrix. For instance, when the number of data input/output pins is 8, the first page buffer group 441 may be configured by eight rows. In other words, the number of rows of the first page buffer group 441 may be the same as the number of data input/output pins. Therefore, when the number of data input/output pins changes, the number of rows of the first page buffer group 441 may also change. However, it is to be noted that the present embodiment is not limited to an embodiment which has the same number of rows and number of data input/output pins. That is, the number of rows of the first page buffer group 441 and the number of data input/output pins may be different. When the page buffers of the first page buffer group 441 are arranged in the form of a matrix, the number of rows may be understood as the same concept as the number of stages.

Eight even page buffers PB Even 0 to 7 may be laid out in each column of the first page buffer group 441. The eight even page buffers PB Even 0 to 7 may be coupled to even bit lines BL, respectively. To this end, eight bit lines BL may be provided in the width of a page buffer in a second direction SD. The bit lines BL may extend in a first direction FD and may be arranged in the second direction SD. While the first direction FD and the second direction SD may be perpendicular to each other, it is to be noted that the present embodiment is not limited thereto. Bit lines BL may be divided into even bit lines and odd bit lines, and page buffers PB may be divided into even page buffers PB Even and odd page buffers PB Odd depending on the bit lines BL coupled thereto.

The page buffers in the first page buffer group 441 may be coupled with caches in the cache circuit 450, respectively. To this end, page lines PL the number of which is the same as the number of the rows of the first page buffer group 441 may be provided in each column of the first page buffer group 441 to be used in coupling page buffers PB Even and caches Cache Even.

The second page buffer group 442 may be configured in a manner similar to that of the first page buffer group 441 except that the page buffers laid out therein are odd page buffers PB Odd instead of even page buffers PB Even.

The cache circuit 450 may include a plurality of caches which are arranged in the form of a matrix. For instance, when the number of data input/output pins is 8, the cache circuit 450 may be configured by 16 rows. Namely, the number of rows of the cache circuit 450 may be two times the number of data input/output pins. Therefore, when the number of data input/output pins is changed, the number of rows of the cache circuit 450 may be changed. However, it is to be noted that the present embodiment is not limited to number of rows being two times the number of data input/output pins. That is, the number of rows of the cache circuit 450 may be greater or less than two times the number of data input/output pins.

When the cache circuit 450 has 16 rows, eight even caches Cache Even 0 to 7 and eight odd caches Cache Odd 0 to 7 may be laid out in each column of the cache circuit 450. Caches may be divided into even caches Cache Even and odd caches Cache Odd depending on page buffers PB coupled thereto. The eight even caches Cache Even 0 to 7 may be respectively coupled to eight even page buffers PB Even 0 to 7, and the eight odd caches Cache Odd 0 to 7 may be respectively coupled to eight odd page buffers PB Odd 0 to 7. To this end, eight page lines PL may be provided in the width of one cache in the second direction SD, at one side of the cache circuit 450. The page lines PL may extend in the first direction FD and may be arranged in the second direction SD. As another method of coupling page buffers and caches, a plurality of page buffers and a plurality of caches may be electrically coupled by using a common page line. This will be described later.

The eight even page buffers PB Even 0 to 7 laid out in a first column 4411 of the first page buffer group 441 and the eight odd page buffers PB Odd 0 to 7 laid out in a first column 4421 of the second page buffer group 442 may configure together one data input/output unit. Eight even page buffers PB Even 0 to 7 or eight odd page buffers PB Odd 0 to 7 among 16 page buffers belonging to one data input/output unit may be a unit that simultaneously operates through eight data input/output pins. The numbers 0 to 7 after PB Even or PB Odd may be understood as the numbers of corresponding data input/output pins.

The 16 caches Cache Even 0 to 7 and Cache Odd 0 to 7 laid out in a first column 4501 of the cache circuit 450 may also configure one data input/output unit. Eight even caches Cache Even 0 to 7 or eight odd caches Cache Odd 0 to 7 among the caches belonging to one data input/output unit may be a unit that simultaneously operates through eight data input/output pins. The numbers 0 to 7 after Cache Even or Cache Odd may be understood as the numbers of corresponding data input/output pins.

The caches Cache Even 0 to 7 and Cache Odd 0 to 7 belonging to the same data input/output unit may be coupled to an input/output circuit through data lines DL<0:7> respectively corresponding thereto. For example, since caches Cache Even 0 corresponding to the data input/output pin IO<0> are laid out in the first row of the cache circuit 450 and caches Cache Even 1 corresponding to the data input/output pin IO<1> are laid out in the second row of the cache circuit 450, two data lines DL<0:1> may be provided between the first row and the second row of the cache circuit 450. As another method, one data line DL may be provided in each row (not shown) of the cache circuit 450. For example, one data line DL<0> may be provided in the first row of the cache circuit 450, and one data line DL<1> may be provided in the second row of the cache circuit 450.

While it is illustrated in FIG. 4 that each of the first page buffer group 441, the second page buffer group 442 and the cache circuit 450 has three columns, this merely a simplified illustration for the sake of convenience in explanation. It is to be noted that the number of columns of each of the first page buffer group 441, the second page buffer group 442 and the cache circuit 450 may vary according to the size of the memory cell array.

Figure 5:
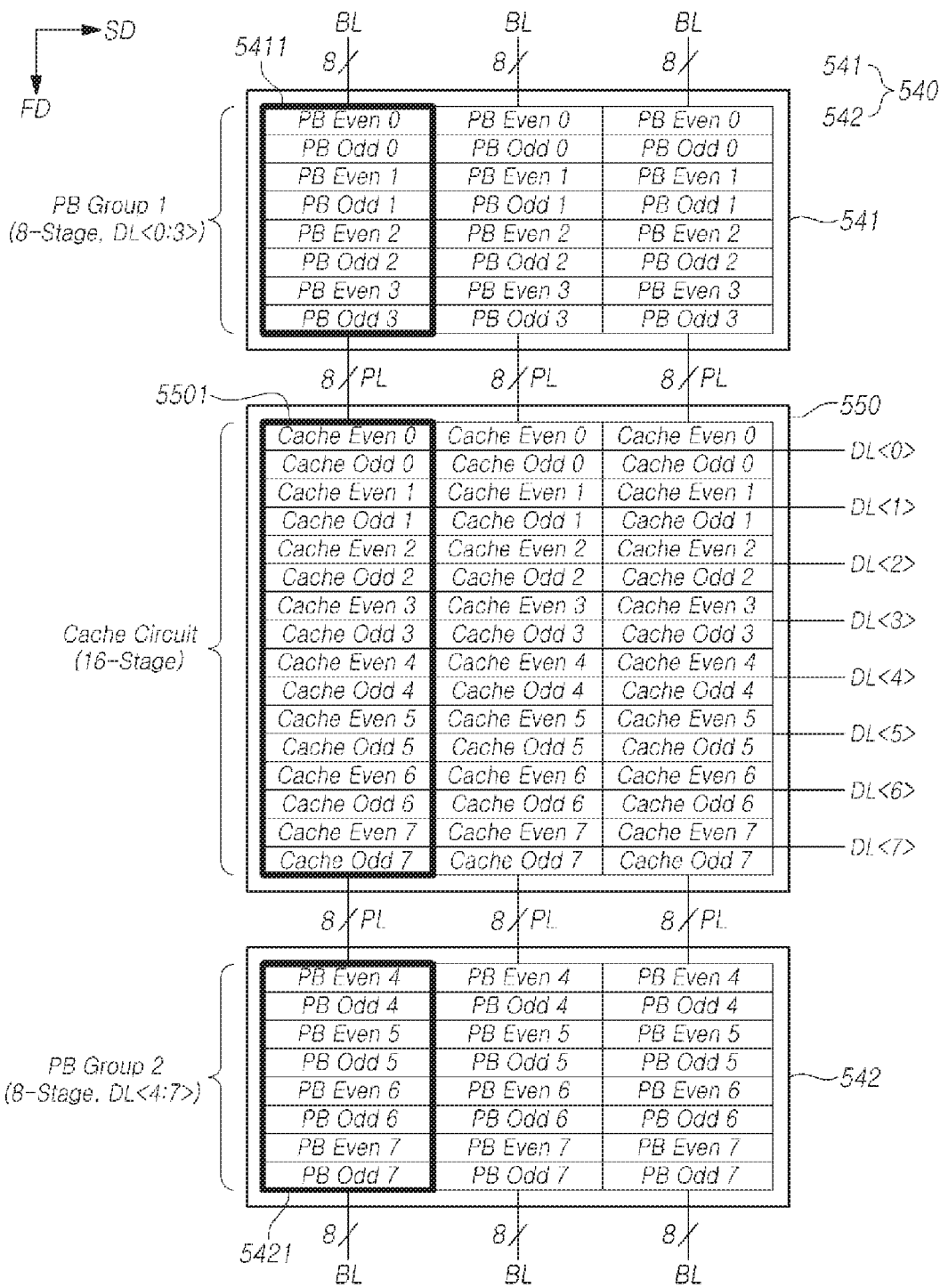

FIG. 5 is a diagram illustrating an example of another internal layout of a page buffer circuit 540 and a cache circuit 550 respectively corresponding to the page buffer circuit 340 and the cache circuit 350 of FIG. 3.

Referring to FIG. 5, a page buffer circuit 540 may be divided into a first page buffer group 541 and a second page buffer group 542 and be disposed at both sides of a cache circuit 550, in a manner similar to FIG. 4. However, the layout of page buffers in the first page buffer group 541 and the second page buffer group 542, and the layout of caches in the cache circuit 550 are different from those of FIG. 4.

Page buffers PB Even 0 to 3 and PB Odd 0 to 3 corresponding to zeroth to third data lines DL<0:3> may be laid out in the first page buffer group 541. For example, page buffers PB Even 0 to 3 and PB Odd 0 to 3 may be laid out in the order of PB Even 0, PB Odd 0, PB Even 1, PB Odd 1, PB Even 2, PB Odd 2, PB Even 3, PB Odd 3 along the first direction FD in each column of the first page buffer group 541. Page buffers PB Even 4 to 7 and PB Odd 4 to 7 corresponding to fourth to seventh data lines DL<4:7> may be laid out in the second page buffer group 542. For example, page buffers PB Even 4 to 7 and PB Odd 4 to 7 may be laid out in the order of PB Even 4, PB Odd 4, PB Even 5, PB Odd 5, PB Even 6, PB Odd 6, PB Even 7, PB Odd 7 along the first direction FD in each column of the second page buffer group 542. That is, the page buffer circuit 540 may be divided into the plurality of page buffer groups 541 and 542 based on corresponding data lines DL. Since the data lines DL<0:7> may respectively correspond to data input/output pins IO<0:7>, it may also be understood that the page buffer circuit 540 is divided into the plurality of page buffer groups 541 and 542 based on corresponding data input/output pins IO.

As the page buffer circuit 540 is divided into the plurality of page buffer groups 541 and 542 based on corresponding data lines DL, the cache circuit 550 may also be laid out based on corresponding data lines DL. In other words, in the cache circuit 550, caches Cache Even 0 to 3 and Cache Odd 0 to 3 corresponding to the zeroth to third data lines DL<0:3> may be laid out in the eight rows positioned close to the first page buffer group 541, and caches Cache Even 4 to 7 and Cache Odd 4 to 7 corresponding to the fourth to seventh data lines DL<4:7> may be laid out in the eight rows positioned close to the second page buffer group 542.

By such a layout of the cache circuit 550, one data line DL may be laid out in two rows of the cache circuit 550. For example, since the caches Cache Even 0 and Cache Odd 0 both corresponding to the zeroth data line DL<0> are laid out in the first row and the second row of the cache circuit 550, it is sufficient that one data line DL<0> is laid out between the first row and the second row of the cache circuit 550. In this way, when the page buffer circuit 540 is divided into the plurality of page buffer groups 541 and 542 based on corresponding data lines DL or corresponding data input/output pins IO, an advantage may be provided in that the wiring of the data lines DL is easy.

While the internal layout of the page buffer circuit 540 and the cache circuit 550 is changed in FIG. 5, the configuration of one data input/output unit may be similar to FIG. 4. The eight page buffers PB Even 0 to 3 and PB Odd 0 to 3 laid out in one column 5411 of the first page buffer group 541 and the eight page buffers PB Even 4 to 7 and PB Odd 4 to 7 laid out in one column 5421 of the second page buffer group 542 may constitute one data input/output unit. Similarly, the 16 caches Cache Even 0 to 7 and Cache Odd 0 to 7 laid out in one column 5501 of the cache circuit 550 may also constitute one data input/output unit.

Figure 6:
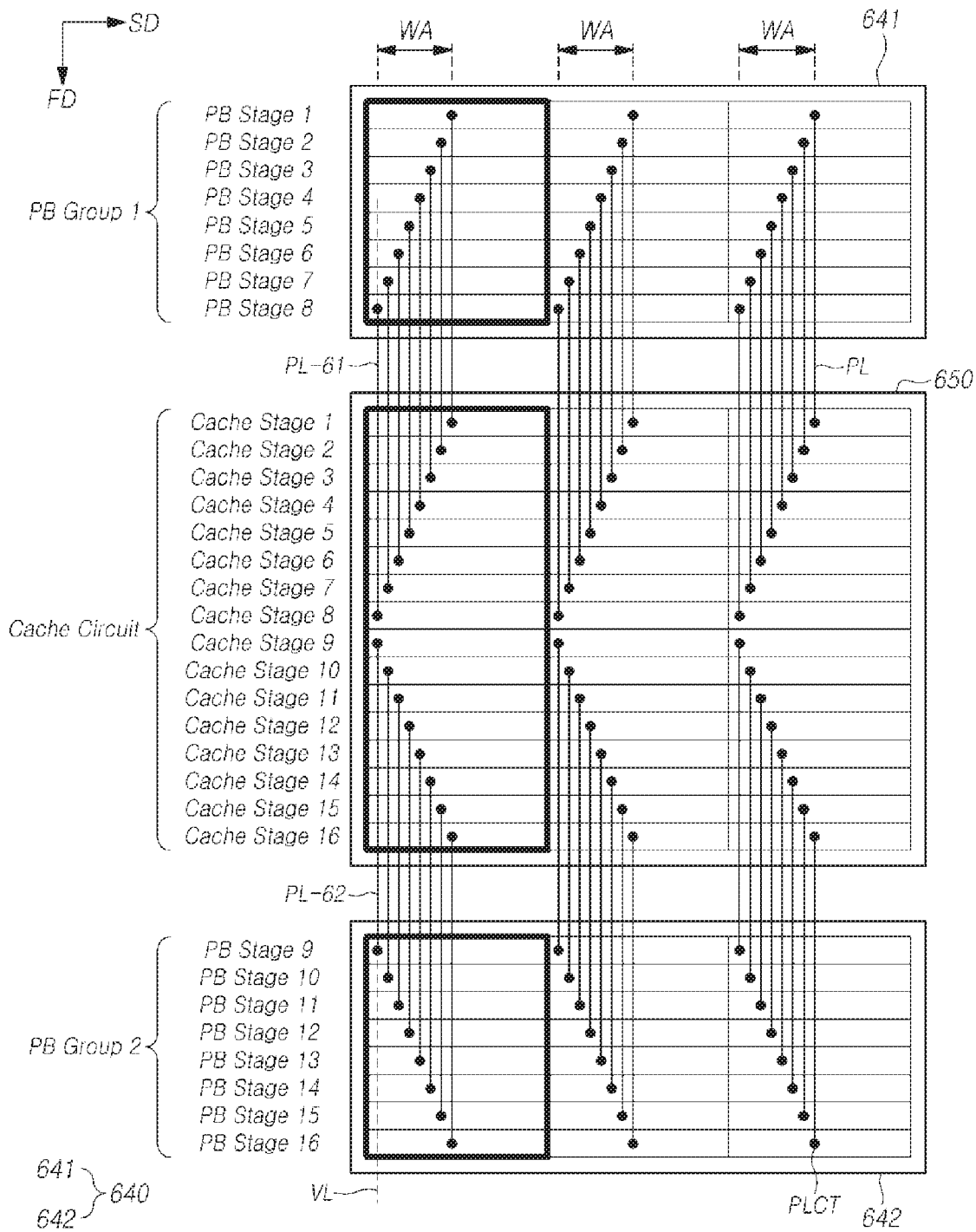
FIGS. 6 and 7 are diagrams illustrating examples of the layouts of page lines in the structure of FIG. 3.

FIG. 6 is a diagram illustrating an example of the layout of page lines PL in the structure of FIG. 3.

Referring to FIG. 6, a page buffer circuit 640 corresponding to the page buffer circuit 340 may be divided into a first page buffer group 641 and a second page buffer group 642 and be disposed at both sides of a cache circuit 650 corresponding to the cache circuit 350. The layout of page buffers and caches in the page buffer circuit 640 and the cache circuit 650 may be implemented similarly as described above with reference to FIGS. 4 and 5, but it is to be noted that the embodiment is not limited thereto.

The first page buffer group 641 may be configured by eight stages PB Stage 1 to 8 and the second page buffer group 642 may be configured by eight stages PB Stage 9 to 16, and the cache circuit 650 may be configured by 16 stages Cache Stage 1 to 16. When the page buffer circuit 640 and the cache circuit 650 are arranged in the form of a matrix, a stage may be understood as a row.

Each page buffer may be coupled with a corresponding cache by using a separate page line PL. That is, in order to couple one page buffer and one corresponding cache, one page line PL may be used. In this case, eight page lines PL may be used within the width of one page buffer in the second direction SD (hereinafter, simply referred to as 'the width of a page buffer'). The eight page lines PL may extend in the first direction FD and be arranged in the second direction SD while having the same line width and gap. Each page line PL may be coupled with a page buffer and a cache through page line contacts PLCT.

The 16 page buffers belonging to one column of the page buffer circuit 640 may be coupled to caches which are laid out at the same stages in the same column. Page lines PL corresponding to the first page buffer group 641 may be laid out in a symmetrical pattern with respect to page lines PL corresponding to the second page buffer group 642 based on the middle of the cache circuit 650.

As described above, 16 page buffers and 16 caches may correspond to one data input/output unit in the case where the number of data input/output pins is 8. Therefore, 16 page lines PL may correspond to one data input/output unit. An area in the second direction SD that is occupied by 16 page lines PL corresponding to one data input/output unit may be defined as a page line wiring area WA.

Since the page buffer circuit 640 is divided into two groups 641 and 642 and is disposed at both sides of the cache circuit 650, 16 page lines PL corresponding to one data input/output unit may be disposed at both sides of the cache circuit 650, eight on each side. Two page lines among 16 page lines may form a pair and the two page lines in each pair may be laid out on the same extending line. For example, a pair of page lines PL-61 and PL-62 may be disposed at both sides of the cache circuit 650 on the same extending line VL. By such a layout, since all of 16 page lines PL corresponding to one data input/output unit may be disposed on eight extending lines, all of the 16 page lines PL may be disposed within the wiring area WA necessary for the layout of eight page lines PL. Therefore, an area necessary for the layout of page lines PL may be reduced.

Figure 7:
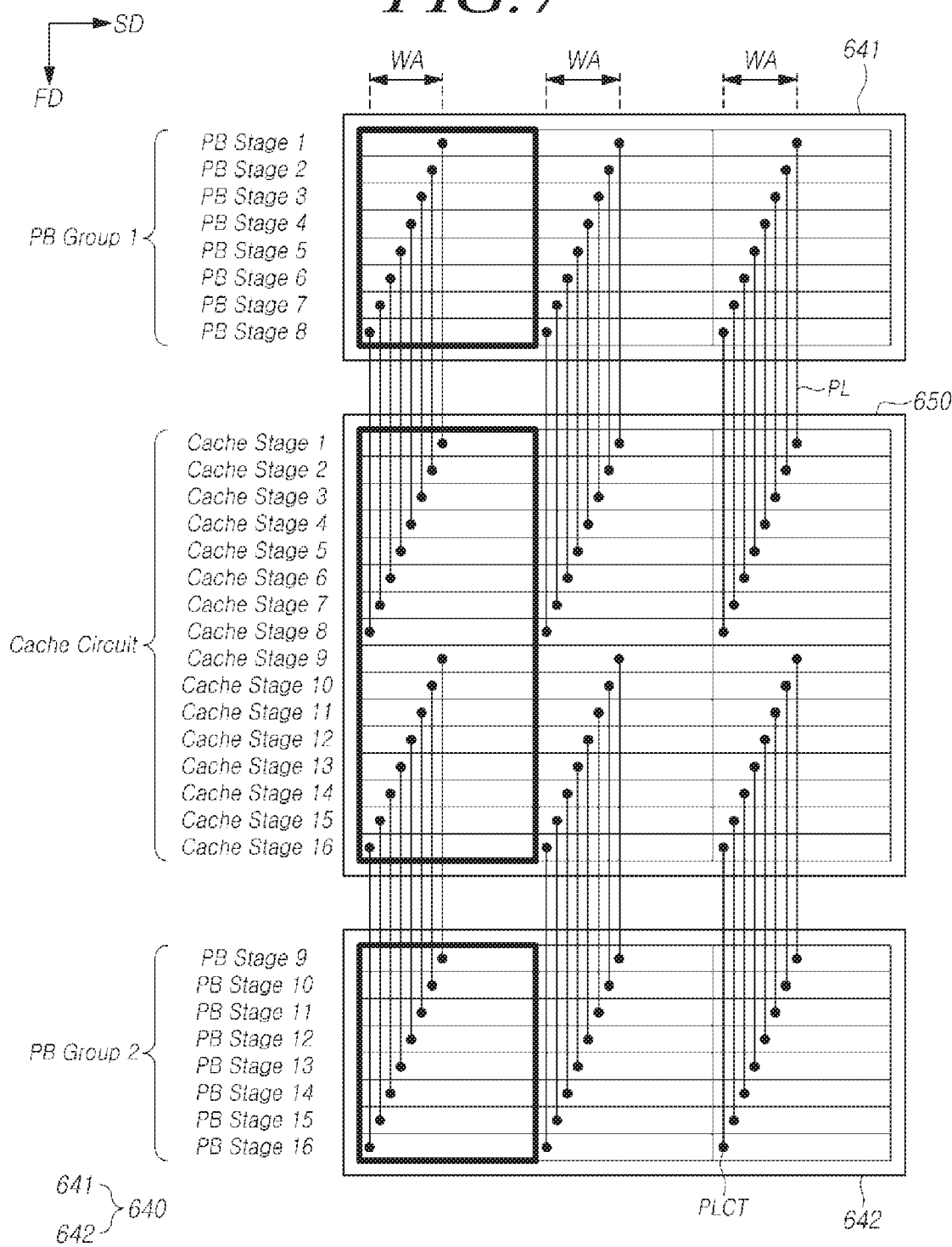

FIG. 7 is a diagram illustrating an example of the layout of page lines PL in the structure of FIG. 3.

Referring to the embodiment shown in FIG. 7, Page lines PL corresponding to the first page buffer group 641 and page lines PL corresponding to the second page buffer group 642 may be disposed not in a symmetrical pattern but in a shifted pattern with respect to the cache circuit 650. Even by the layout of page lines PL illustrated in FIG. 7, since all of 16 page lines PL corresponding to one data input/output unit may be laid out within the wiring area WA necessary for the layout of eight page lines PL, an advantage may be provided in that an area necessary for the layout of page lines PL may be reduced.

Figure 8:
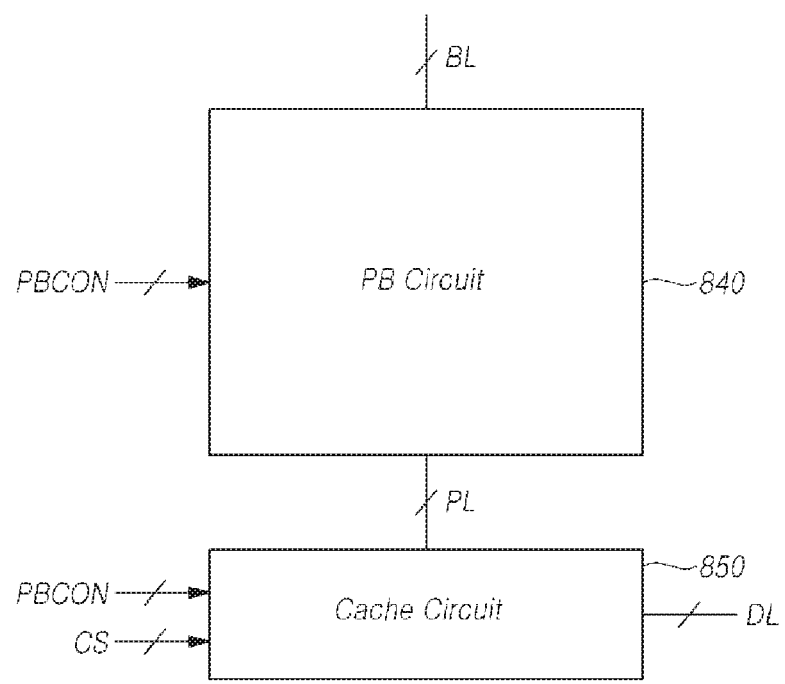
FIG. 8 is a block diagram illustrating a comparative example of a structure of a page buffer circuit and a cache circuit.
Figure 9:
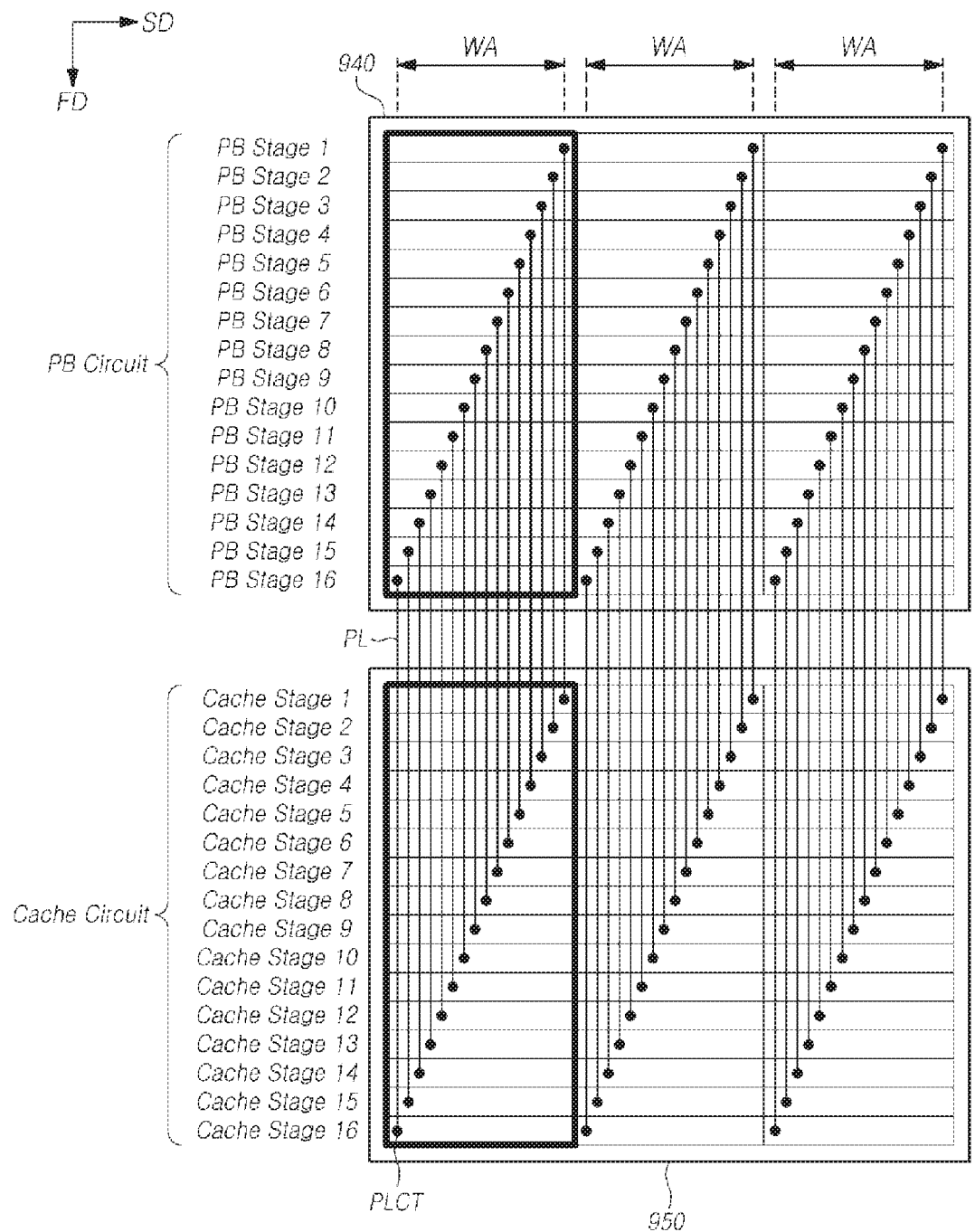
FIG. 9 is a diagram illustrating an example of the layout of page lines in the structure of FIG. 8.

In contrast to the above-described embodiments, FIG. 8 is a block diagram illustrating a comparative example of a structure of a page buffer circuit and a cache circuit, and FIG. 9 is a diagram illustrating an example of the layout of page lines in the structure of FIG. 8.

Referring to FIG. 8, unlike the embodiment in FIG. 3, a page buffer circuit 840 is not divided into a plurality of regions and is wholly disposed at one side of a cache circuit 850.

Referring to FIG. 9, a page buffer circuit 940 may be configured by 16 page buffer stages PB Stage 1 to 16, and, also, a cache circuit 950 may be configured by 16 cache stages Cache Stage 1 to 16.

Sixteen page buffers configuring one data input/output unit may be coupled to caches configuring one data input/output unit through 16 page lines PL, respectively. The 16 page lines PL corresponding to one data input/output unit may be arranged in the second direction SD with a predetermined gap. By such a layout of page lines PL, a problem exists in that a wiring area WA necessary for the layout of the page lines PL increases. When compared to the embodiment of FIG. 6 or FIG. 7, it may be seen that the wiring area WA necessary for the layout of page lines PL corresponding to one data input/output unit increases to two times in the embodiment described in FIGS. 8 and 9.

As a consequence, according to the various embodiments of the present invention, the wiring area WA necessary for the layout of page lines PL may be reduced, and a wiring area secured in this way may be utilized to be allocated to power lines to reduce a voltage drop of the power lines and thereby reduce power consumption or to increase the gap between wiring lines to decrease the interference between signals. Further, because the length of each page line PL in the first direction FD in the above-described embodiment is reduced to about half of the length of each page line PL in the first direction FD in the comparative example, a signal transfer delay may be reduced and a material for forming wiring lines may be saved.

Figure 10:
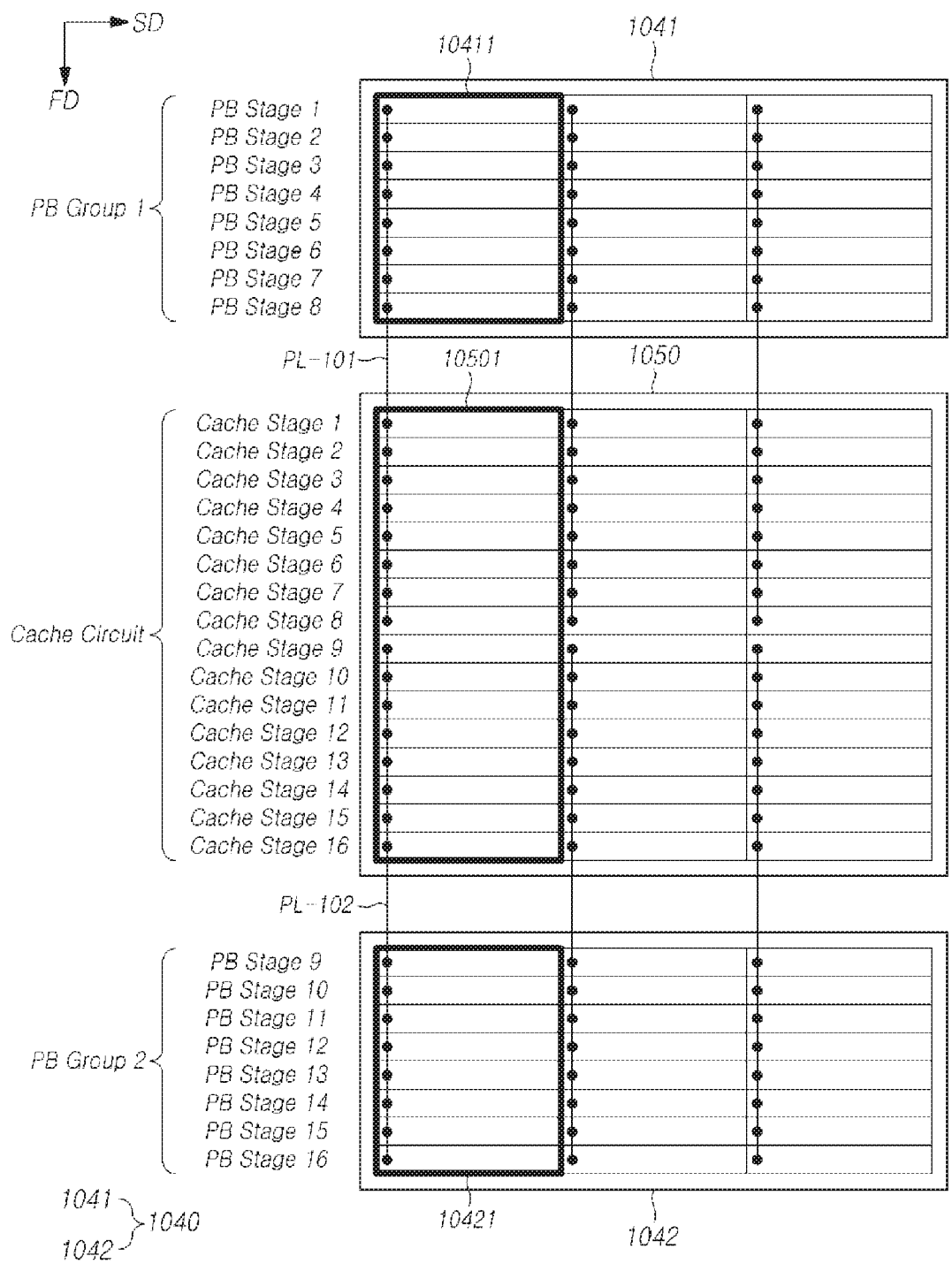
FIG. 10 is a diagram illustrating an example of another layout of page lines in the structure of FIG. 3.

FIG. 10 is a diagram illustrating an example of another layout of page lines PL in the structure of FIG. 3.

Referring to FIG. 10, a page buffer circuit 1040 corresponding to the page buffer circuit 340 may be divided into a first page buffer group 1041 and a second page buffer group 1042 and be disposed at both sides of a cache circuit 1050 corresponding to the cache circuit 350. The layout of page buffers and caches in the page buffer circuit 1040 and the cache circuit 1050 may be implemented according to the descriptions made above with reference to FIGS. 4 and 5 or according to other ways.

Eight page buffers belonging to one column 10411 of the first page buffer group 1041 and eight page buffers belonging to one column 10421 of the second page buffer group 1042 may constitute one data input/output unit. Also, 16 caches belonging to one column 10501 of the cache circuit 1050 may constitute one data input/output unit.

The eight page buffers belonging to the one column 10411 of the first page buffer group 1041 may be electrically coupled with the eight caches belonging to the one column 10501 of the cache circuit 1050 while sharing a page line PL-101. The eight page buffers belonging to the one column 10421 of the second page buffer group 1042 may be electrically coupled with the remaining eight caches belonging to the one column 10501 of the cache circuit 1050 while sharing a page line PL-102. The pair of page lines PL-101 and PL-102 corresponding to one data input/output unit may be laid out at both sides of the cache circuit 1050 on the same extending line. In other words, both the page lines PL-101 and PL-102 corresponding to one data input/output unit may be laid out on one extending line.

Figure 11:
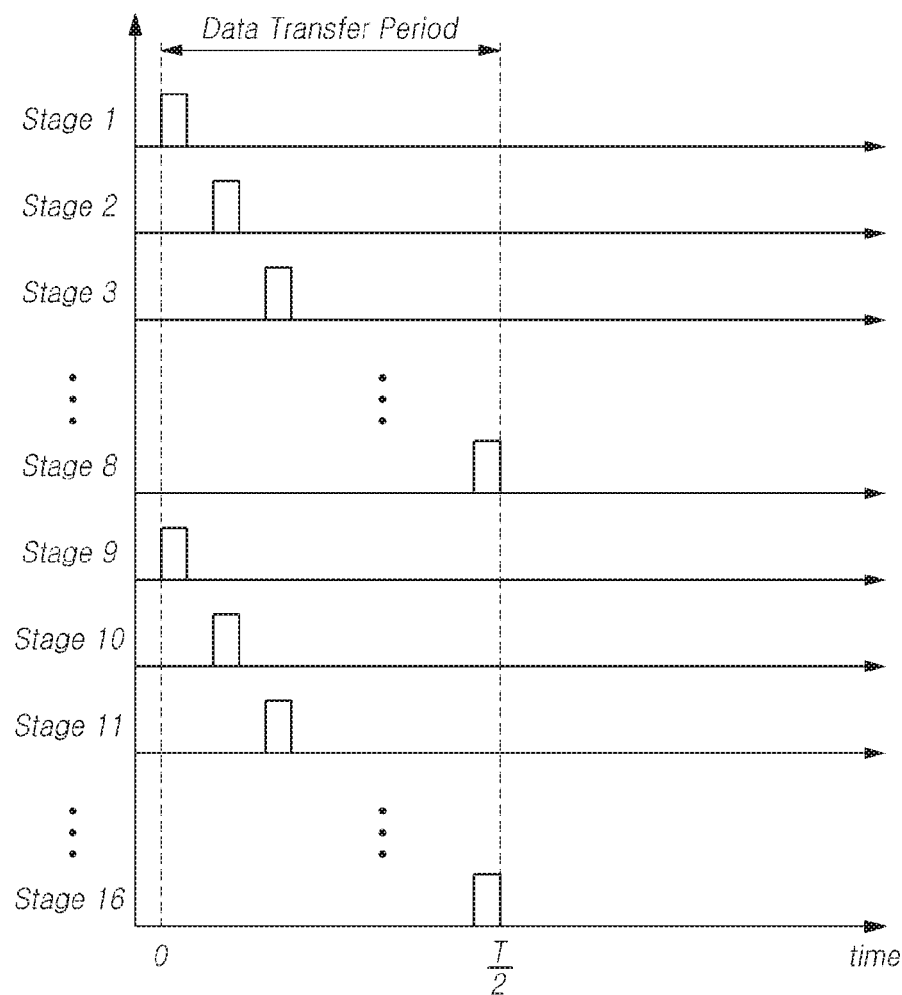
FIG. 11 is a diagram illustrating an example of data transfer waveforms for the page line layout of FIG. 10.

When a plurality of page buffers share a page line PL in this way, data may be transferred between the plurality of page buffers and a plurality of caches by using a time division scheme, as illustrated in FIG. 11.

Referring to FIGS. 10 and 11, the eight page buffers and eight caches belonging to a stage 1 to a stage 8 (i.e., PB stage 1 to PB stage 8 and Cache stage 1 to Cache stage 8) may transfer data through the one page line PL-101, and the eight page buffers and eight caches belonging to a stage 9 to a stage 16 (i.e., PB stage 9 to PB stage 16 and Chache stage 9 to Cache stage 16) may transfer data through the one page line PL-102. To this end, the eight stages may sequentially use the page line PL-101 in such a manner that the page buffer and cache belonging to the stage 1 first transfer data and then the page buffer and cache belonging to the stage 2 transfer data. Moreover, the eight stages may sequentially use the page line PL-102 in such a manner that the page buffer and cache belonging to the stage 9 first transfer data and then the page buffer and cache belonging to the stage 10 transfer data. The two page lines PL-101 and PL-102 may be simultaneously used in such a manner that the data transfer of the stage 1 and the stage 9 is simultaneously performed. According to the present embodiment, a data transfer period required to transfer the data of 16 page buffers corresponding to one data input/output unit to 16 caches may be reduced to about half when compared to the case of using only one data line as shown in FIG. 13.

When the two page buffer groups 1041 and 1042 disposed at both sides of the cache circuit 1050 have different numbers of stages, the data transfer period of any one of the two page buffer groups 1041 and 1042 may increase. Therefore, it is advantageous in terms of shortening a data transfer period to dispose the two page buffer groups 1041 and 1042 to have the same number of stages. In this case, the two page lines PL-101 and PL-102 corresponding to one data input/output unit may be substantially the same in their lengths.

Figure 12:
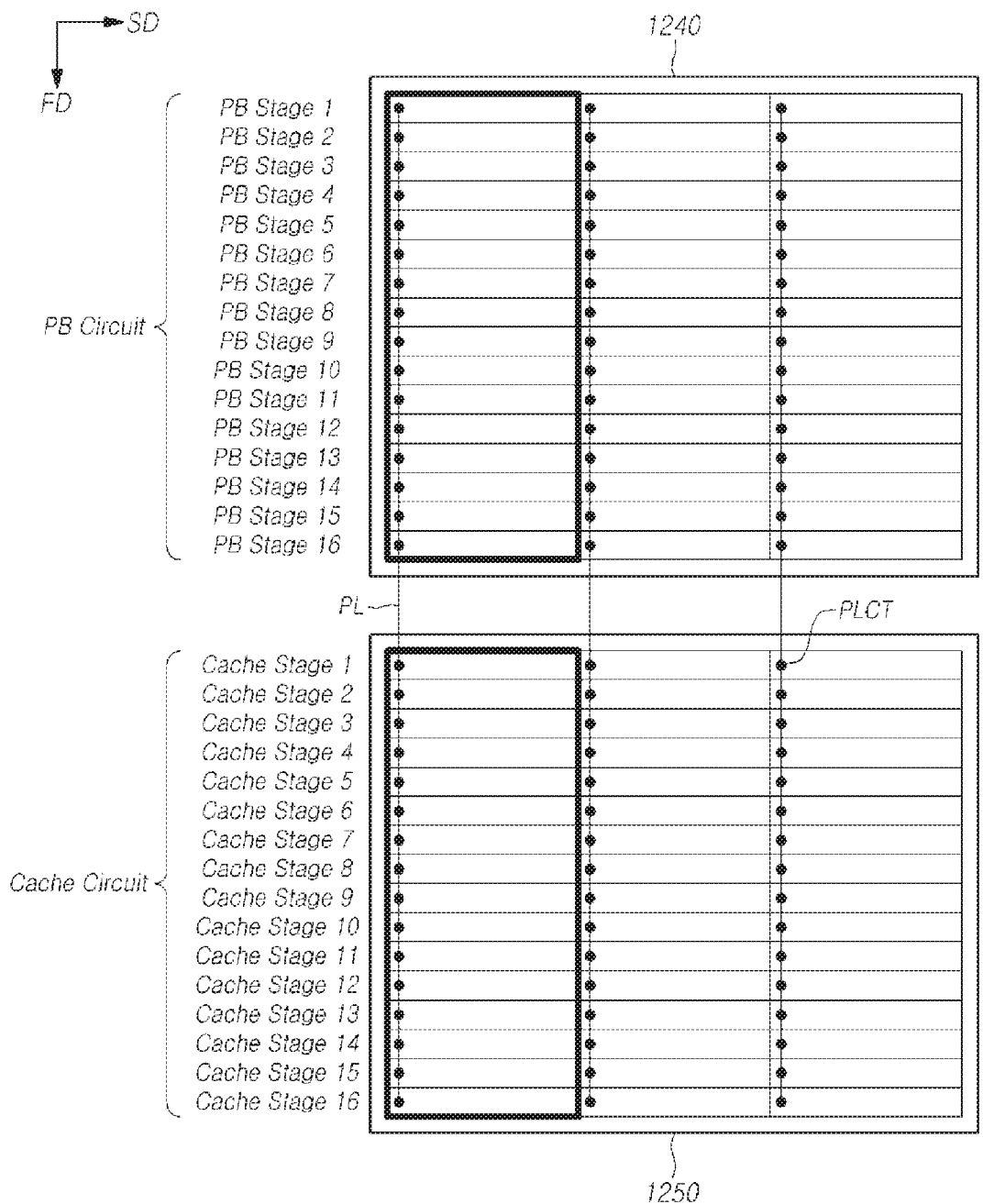
FIG. 12 is a diagram illustrating a comparative example of a layout of page lines in the structure of FIG. 8.
Figure 13:
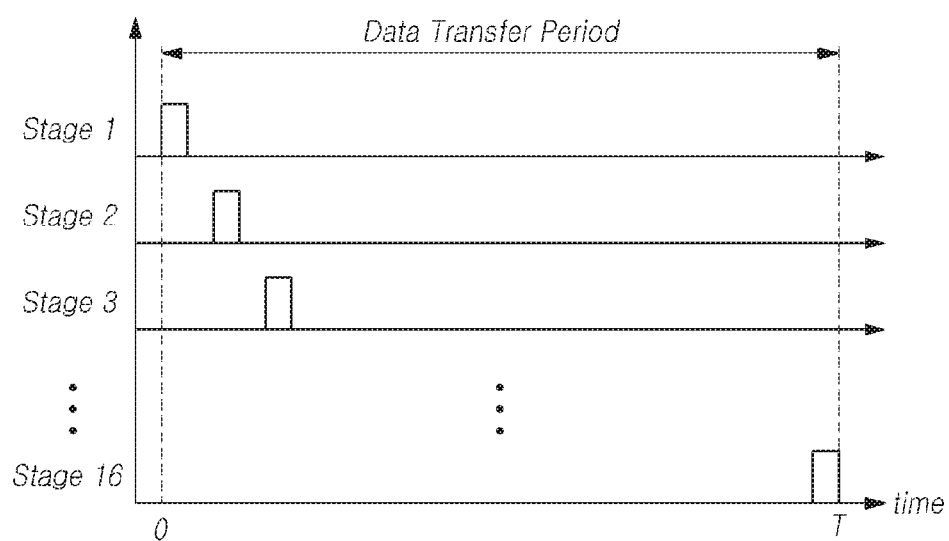
FIG. 13 is a diagram illustrating a comparative example of data transfer waveforms for the page line layout of FIG. 12.

In contrast to the embodiments shown in FIGS. 10 and 11, FIG. 12 is a diagram illustrating a comparative example of a layout of page lines in the structure of FIG. 8, and FIG. 13 is a diagram illustrating a comparative example of data transfer waveforms for the page line layout of FIG. 12.

Referring to FIG. 12, the structure of a page buffer circuit 1240 and a cache circuit 1250 is the same as FIG. 9, but in FIG. 12, all of 16 page buffers corresponding to one data input/output unit are coupled to 16 caches while sharing one page line PL.

In this case, as shown in FIG. 13, since the page buffers of 16 stages transfer data to corresponding caches by sequentially using the page line PL, a problem exists in that a data transfer period required to transfer all data of page buffers corresponding to one data input/output unit increases.

Therefore, according to the embodiment of FIGS. 10 and 11, advantages may be provided in that a data transfer period between a page buffer circuit and a cache circuit is shortened and thereby the operating speed of a memory device may be improved.

Figure 14:
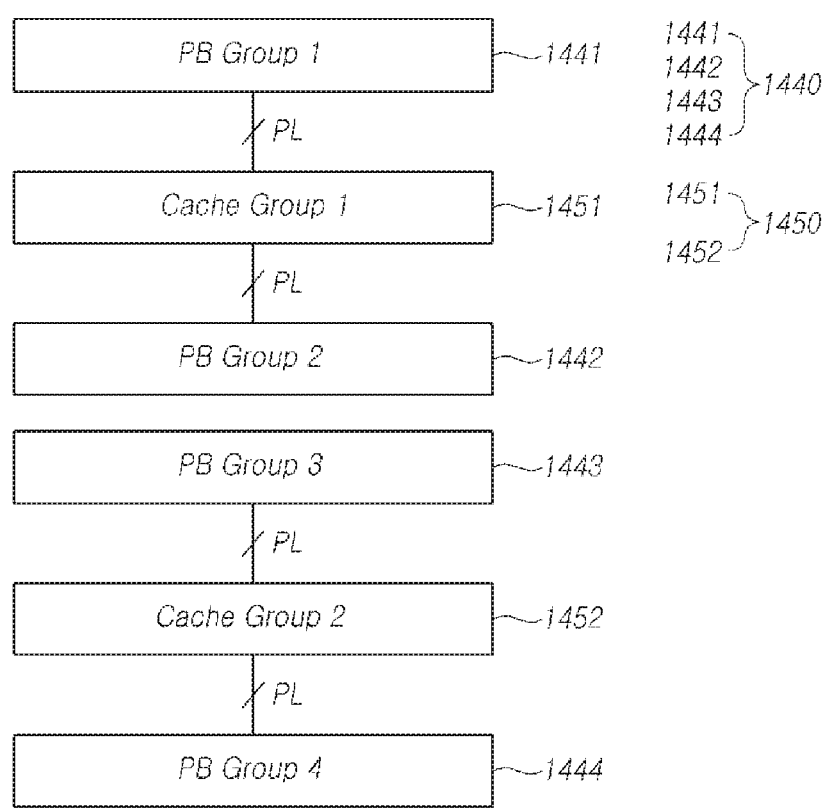
FIG. 14 is a block diagram illustrating an example of the structure of a page buffer circuit and a cache circuit in accordance with an embodiment.

FIG. 14 is a block diagram illustrating an example of the structure of a page buffer circuit and a cache circuit in accordance with an embodiment.

Referring to FIG. 14, a page buffer circuit 1440 may be divided into first to fourth page buffer groups 1441 to 1444. A cache circuit 1450 may be divided into a first cache group 1451 and a second cache group 1452. The first page buffer group 1441 and the second page buffer group 1442 may be disposed at both sides of the first cache group 1451, and the third page buffer group 1443 and the fourth page buffer group 1444 may be disposed at both sides of the second cache group 1452. The first cache group 1451 may be electrically coupled with the first page buffer group 1441 and the second page buffer group 1442 through page lines PL, and the second cache group 1452 may be electrically coupled with the third page buffer group 1443 and the fourth page buffer group 1444 through page lines PL. For instance, the first page buffer group 1441, the first cache group 1451, the second page buffer group 1442, the third page buffer group 1443, the second cache group 1452 and the fourth page buffer group 1444 may be disposed in that sequence.

When the page buffer groups 1441 to 1444 are spatially divided from one another, the page buffer circuit 1440 may be understood as being divided into a plurality of page buffer regions. Similarly, when the cache groups 1451 and 1452 are spatially divided from each other, the cache circuit 1450 may be understood as being divided into a plurality of cache regions.

In this way, the cache circuit 1450 may be divided into the plurality of cache groups 1451 and 1452, and the page buffer circuit 1440 may be divided into the page buffer groups 1441 to 1444 the number of which is two times the number of cache groups. A pair of page buffer groups may be disposed at both sides of a corresponding one cache group.

Figure 15:
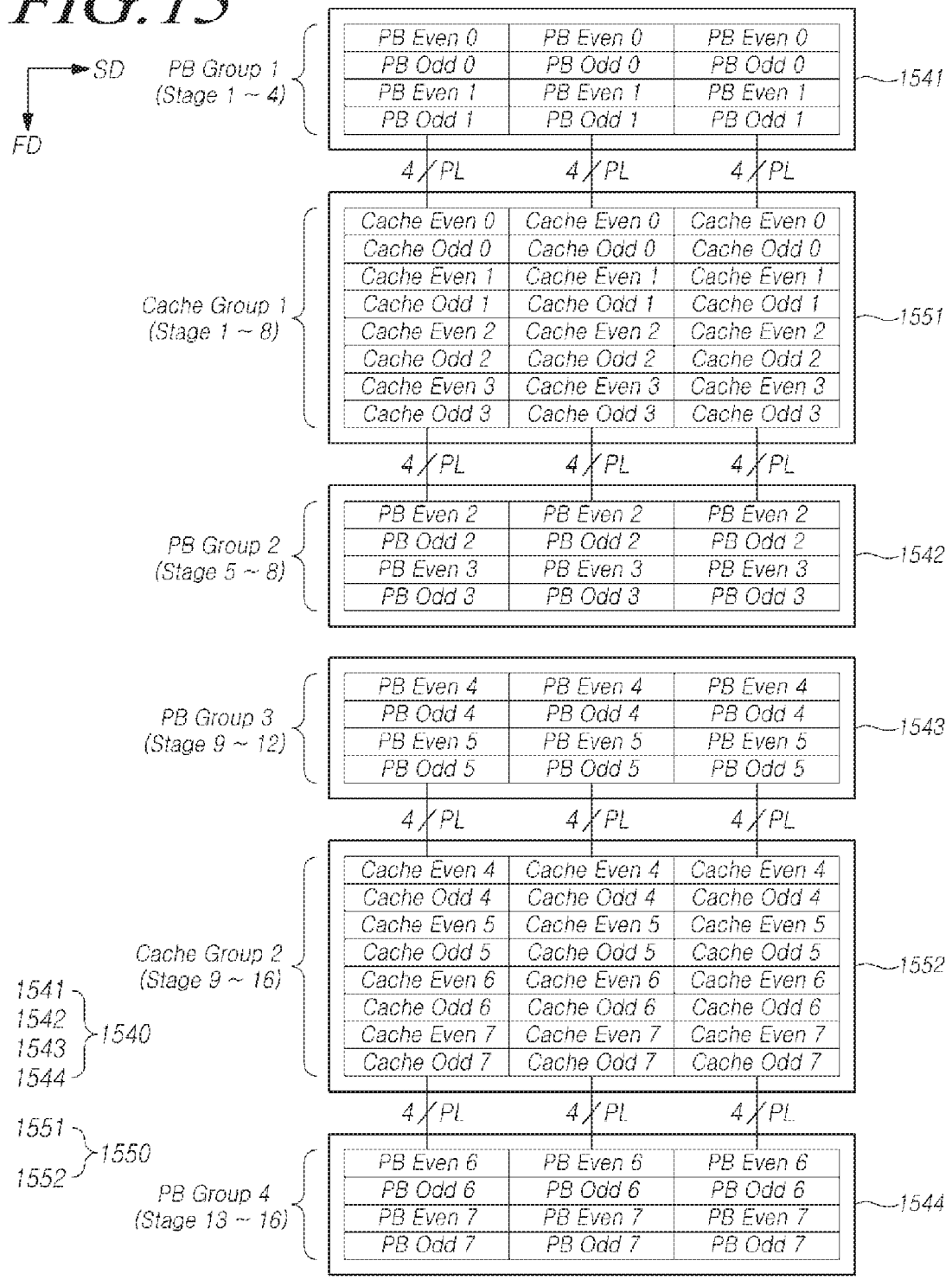
FIGS. 15 and 16 are diagrams illustrating examples of the internal layouts of the page buffer circuit and the cache circuit of FIG. 14.
Figure 16:
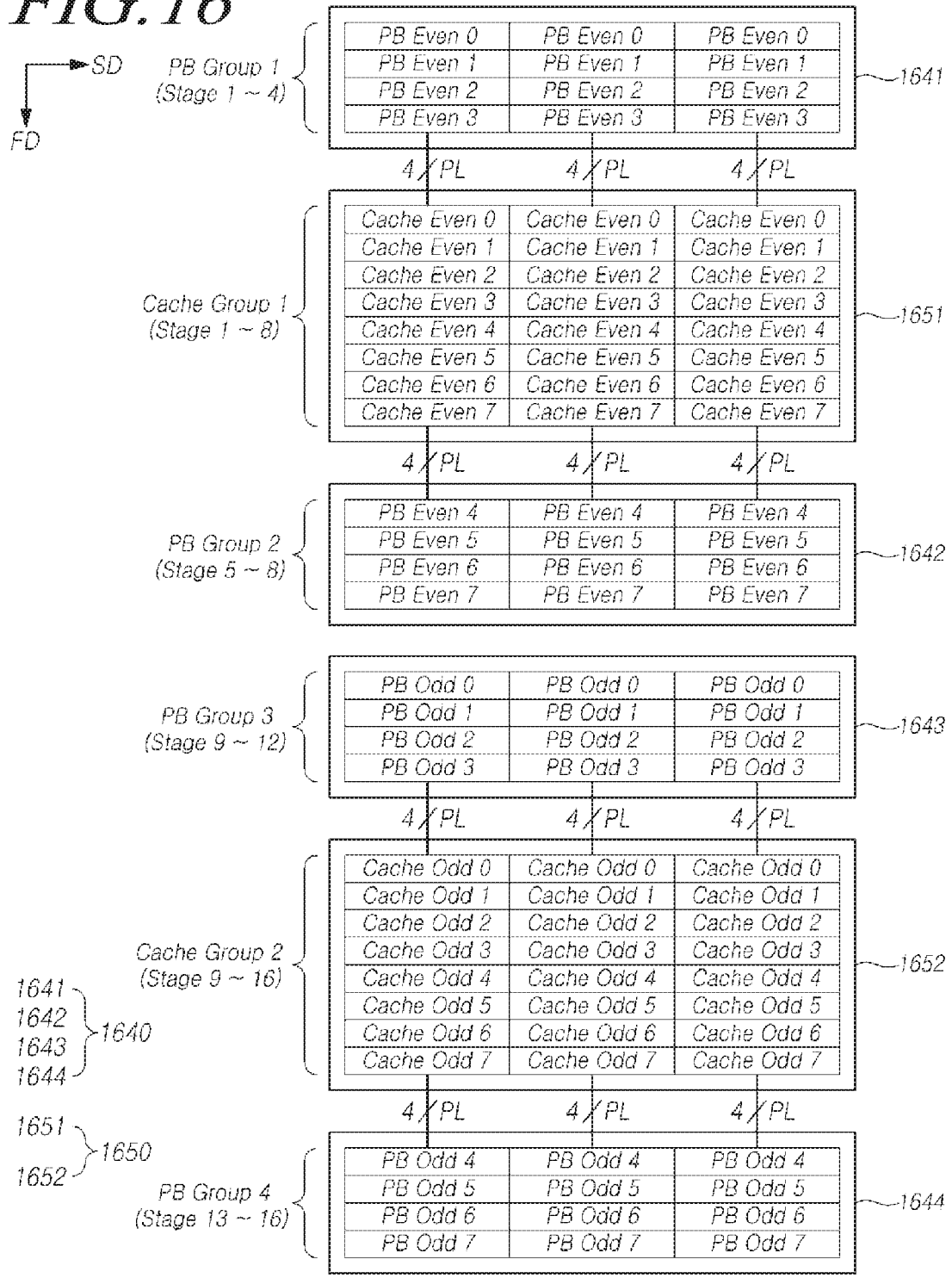

FIGS. 15 and 16 are diagrams illustrating examples of the internal layouts of the page buffer circuit 1440 and the cache circuit 1450 of FIG. 14.

Referring to FIG. 15, page buffers PB Even 0 and 1 and PB Odd 0 and 1 corresponding to zeroth and first data lines DL<0:1> may be laid out in a first page buffer group 1541. For example, page buffers PB Even 0 to 1 and PB Odd 0 to 1 may be laid out in the order of PB Even 0, PB Odd 0, PB Even 1, PB Odd 1 along the first direction FD in each column of the first page buffer group 1541. Page buffers PB Even 2 and 3 and PB Odd 2 and 3 corresponding to second and third data lines DL<2:3> may be laid out in a second page buffer group 1542. For example, page buffers PB Even 2 to 3 and PB Odd 2 to 3 may be laid out in the order of PB Even 2, PB Odd 2, PB Even 3, PB Odd 3 along the first direction FD in each column of the second page buffer group 1542. Page buffers PB Even 4 and 5 and PB Odd 4 and 5 corresponding to fourth and fifth data lines DL<4:5> may be laid out in a third page buffer group 1543. For example, page buffers PB Even 4 to 5 and PB Odd 4 to 5 may be laid out in the order of PB Even 4, PB Odd 4, PB Even 5, PB Odd 5 along the first direction FD in each column of the third page buffer group 1543. Page buffers PB Even 6 and 7 and PB Odd 6 and 7 corresponding to sixth and seventh data lines DL<6:7> may be laid out in a fourth page buffer group 1544. For example, page buffers PB Even 6 to 7 and PB Odd 6 to 7 may be laid out in the order of PB Even 6, PB Odd 6, PB Even 7, PB Odd 7 along the first direction FD in each column of the fourth page buffer group 1544. In other words, a page buffer circuit 1540 may be divided into the plurality of page buffer groups 1541, 1542, 1543 and 1544 based on corresponding data lines DL.

Caches Cache Even 0 to 3 and Cache Odd 0 to 3 corresponding to zeroth to third data lines DL<0:3> may be laid out in a first cache group 1551, and caches Cache Even 4 to 7 and Cache Odd 4 to 7 corresponding to fourth to seventh data lines DL<4:7> may be laid out in a second cache group 1552. That is, a cache circuit 1550 may be divided into the plurality of cache groups 1551 and 1552 based on corresponding data lines DL.

In this way, when the page buffer circuit 1540 and the cache circuit 1550 are divided into pluralities of groups based on corresponding data lines DL or corresponding data input/output pins IO, an advantage may be provided in that the wiring of the data lines DL becomes easier.

Referring to FIG. 16, a difference from FIG. 15 exists in that any one kind of page buffers between even and odd page buffers may be laid out in each of a plurality of page buffer groups 1641 to 1644. Similarly, any one kind of caches between even and odd caches may be laid out in each of a plurality of cache groups 1651 and 1652.

Figure 17:
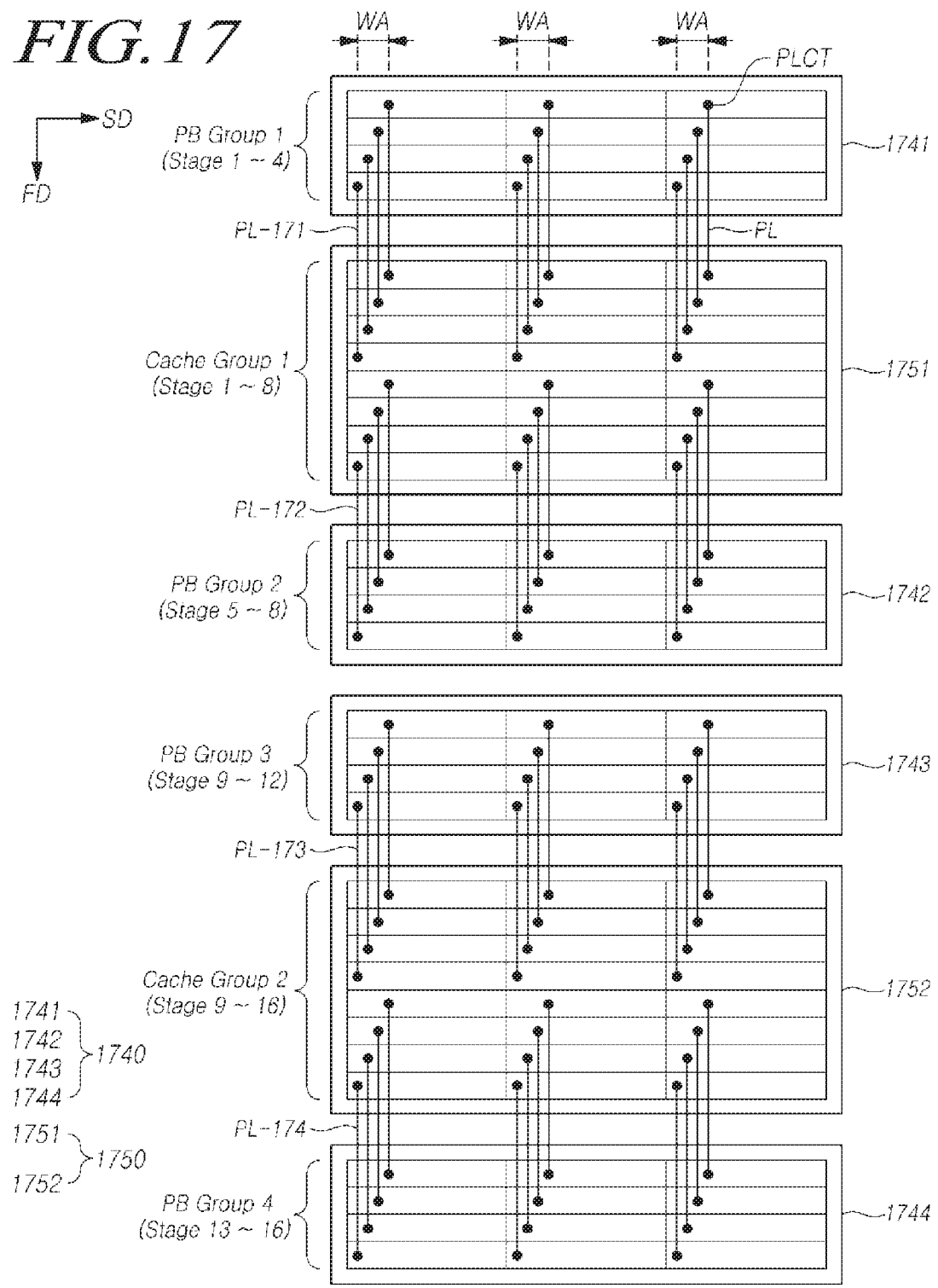
FIGS. 17 to 19 are diagrams illustrating examples of the layouts of page lines in the structure of FIG. 14.
Figure 18:
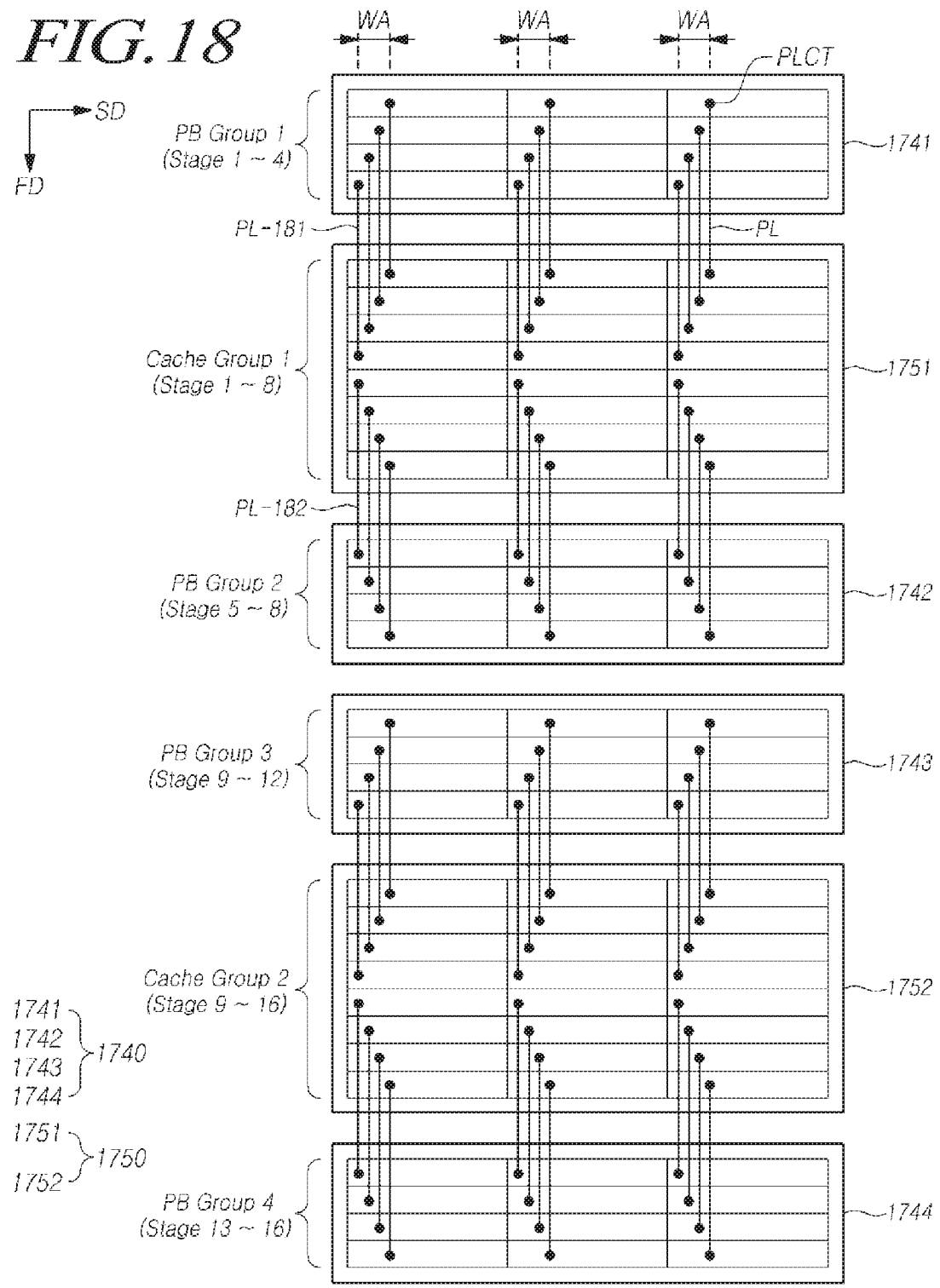
Figure 19:
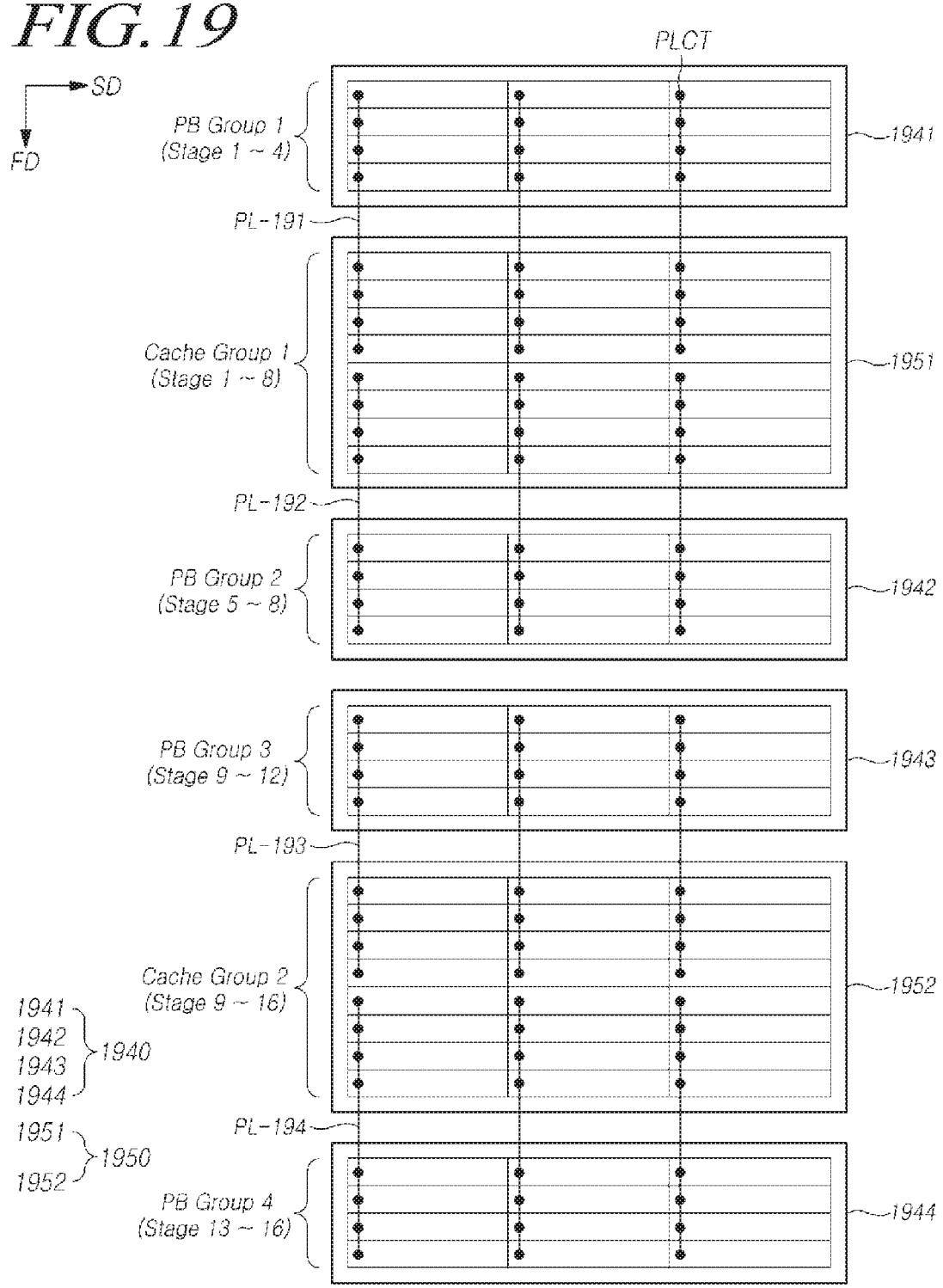

FIGS. 17 to 19 are diagrams illustrating examples of the layouts of page lines PL in the structure of FIG. 14.

Referring to FIG. 17, each page buffer may be coupled with a corresponding cache by using a separate page line PL. For instance, four page buffers belonging to one column of a first page buffer group 1741 may be coupled with four caches belonging to one column of a first cache group 1751 through four page lines PL. The four page buffers belonging to one column of a second page buffer group 1742 may be coupled with the other four caches belonging to one column of the first cache group 1751 through four page lines PL. Each of the four page lines PL corresponding to the first page buffer group 1741 (e.g., a page line PL-171) and each of the four page lines PL corresponding to the second page buffer group 1742 (e.g., a page line PL-172) may form a pair and may be laid out on the same extending line at both sides of the first cache group 1751.

Coupling of page lines PL between third and fourth page buffer groups 1743 and 1744 and a second cache group 1752 may also be similar thereto.

The 16 page buffers configuring one data input/output unit may be laid out by being distributed in the four page buffer groups 1741 to 1744. For instance, the 16 page buffers laid out in the same columns of the four page buffer groups 1741 to 1744 may constitute the same data input/output unit. In this case, among the 16 page lines PL corresponding to one data input/output unit, four page lines (e.g., page lines PL-171 to PL-174) may be laid out on the same extending line. Therefore, since all the 16 page lines PL corresponding to one data input/output unit may be laid out on four extending lines, a wiring area WA of page lines PL corresponding to one data input/output unit may be further reduced. Further, the length of each of page lines PL may be reduced to about ¼ when compared to the comparative example of FIG. 9. The four page lines (e.g., the page lines PL-171 to PL-174) disposed on one extending line may be substantially the same in their lengths.

FIG. 18 has a different layout of page lines PL when compared to FIG. 17. In, FIG. 17, a pair of page lines (e.g., the page lines PL-171 and PL-172) are laid out in a shifted pattern at both sides of the first cache group 1751, whereas, in FIG. 18, a pair of page lines (e.g., page lines PL-181 and PL-182) are laid out in a symmetrical pattern with respect to a first cache group 1751. Even in the case where page lines PL are laid out in the pattern as shown in FIG. 18, advantages may be provided in that a wiring area WA of page lines PL and the length of page lines PL are reduced.

FIG. 19 illustrates a case where a plurality of page buffers share a page line PL. In other words, in each of page buffer groups 1941, 1942, 1943 and 1944, the page buffers belonging to one data input/output unit may be coupled with corresponding caches through one page line PL. For instance, in the first page buffer group 1941, the four page buffers belonging to one data input/output unit may be coupled to corresponding caches through one page line PL-191. Even in each of the other page buffer groups 1942, 1943 and 1944, page buffers may be coupled to corresponding caches by using each of page lines PL-192, PL-193 and PL-194. In this case, four page lines (e.g., the page lines PL-191, PL-192, PL-193 and PL-194) corresponding to one data input/output unit may be laid out on the same extending line. Among them, the pair of page lines PL-191 and PL-192 may be laid out at both sides of a first cache group 1951, and the remaining pair of page lines PL-193 and PL-194 may be laid out at both sides of a second cache group 1952.

Figure 20:
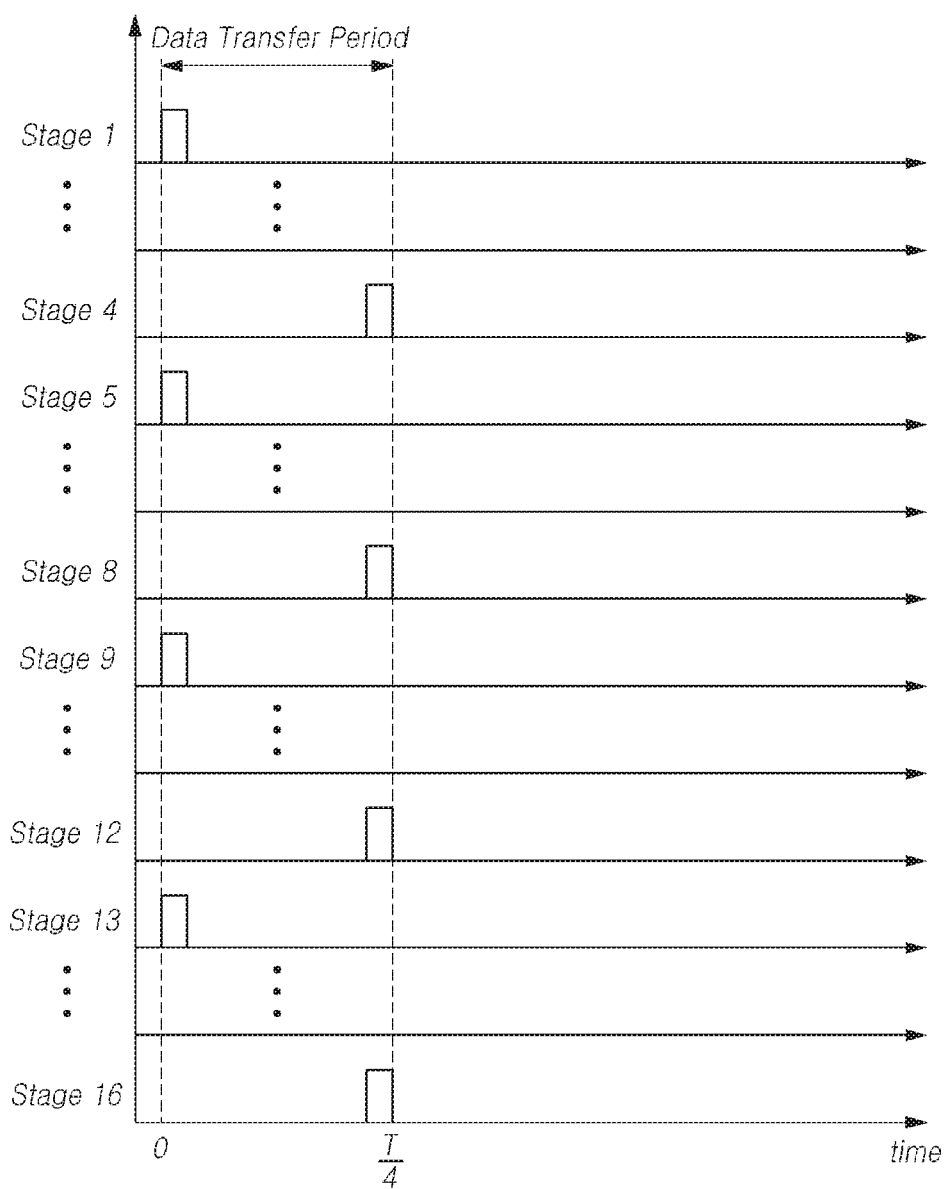
FIG. 20 is a diagram illustrating an example of data transfer waveforms for the page line layout of FIG. 19.

FIG. 20 is a diagram illustrating an example of data transfer waveforms for the page line layout of FIG. 19.

Referring to FIGS. 19 and 20, because the four page lines PL-191, PL-192, PL-193 and PL-194 may correspond to one data input/output unit and four page buffers may simultaneously transfer data, data transfer of 16 page buffers may be completed all within a time required for four sequential data transfers. In this way, according to the present embodiment, when compared to the comparative example of FIG. 13, a data transfer period may be shortened to about ¼.

Figure 21:
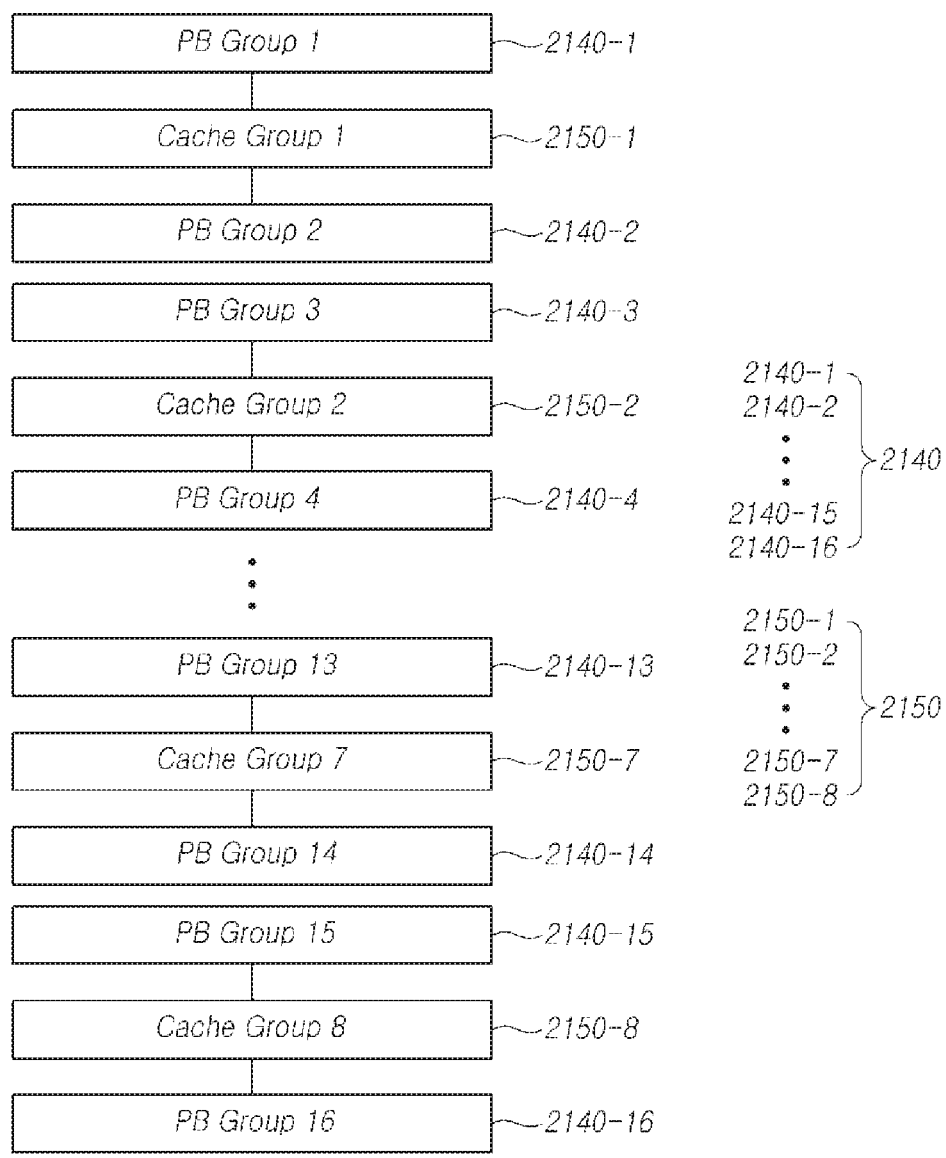
FIG. 21 is a block diagram illustrating an example of the structure of a page buffer circuit and a cache circuit in accordance with an embodiment.

FIG. 21 is a block diagram illustrating an example of the structure of a page buffer circuit and a cache circuit in accordance with an embodiment.

Referring to FIG. 21, a page buffer circuit 2140 may be divided into first to sixteenth page buffer groups 2140-1 to 2140-16. A cache circuit 2150 may be divided into first to eighth cache groups 2150-1 to 2150-8. The first page buffer group 2140-1 and the second page buffer group 2140-2 may be disposed at both sides of the first cache group 2150-1. Each pair of the remaining 14 page buffer groups 2140-3 to 2140-16 may be configured in a manner similar as described above and may be laid out at both sides of each of the remaining seven cache groups 2150-2 to 2150-8.

In this way, a cache circuit may be divided into a plurality of cache groups, a page buffer circuit may be divided into a plurality of page buffer groups the number of which is two times the number of the cache groups, and each pair of page buffer groups may be disposed at both sides of each cache group.

While it is illustrated in FIG. 21 that the page buffer circuit 2140 is divided into 16 page buffer groups 2140-1 to 2140-16 and the cache circuit 2150 is divided into eight cache groups 2150-1 to 2150-8, this is for the specific case where the number of data input/output pins is 8. When the number of data input/output pins is N, a page buffer circuit may be divided into 2N number of groups, and a cache circuit may be divided into N number of groups.

Figure 22:
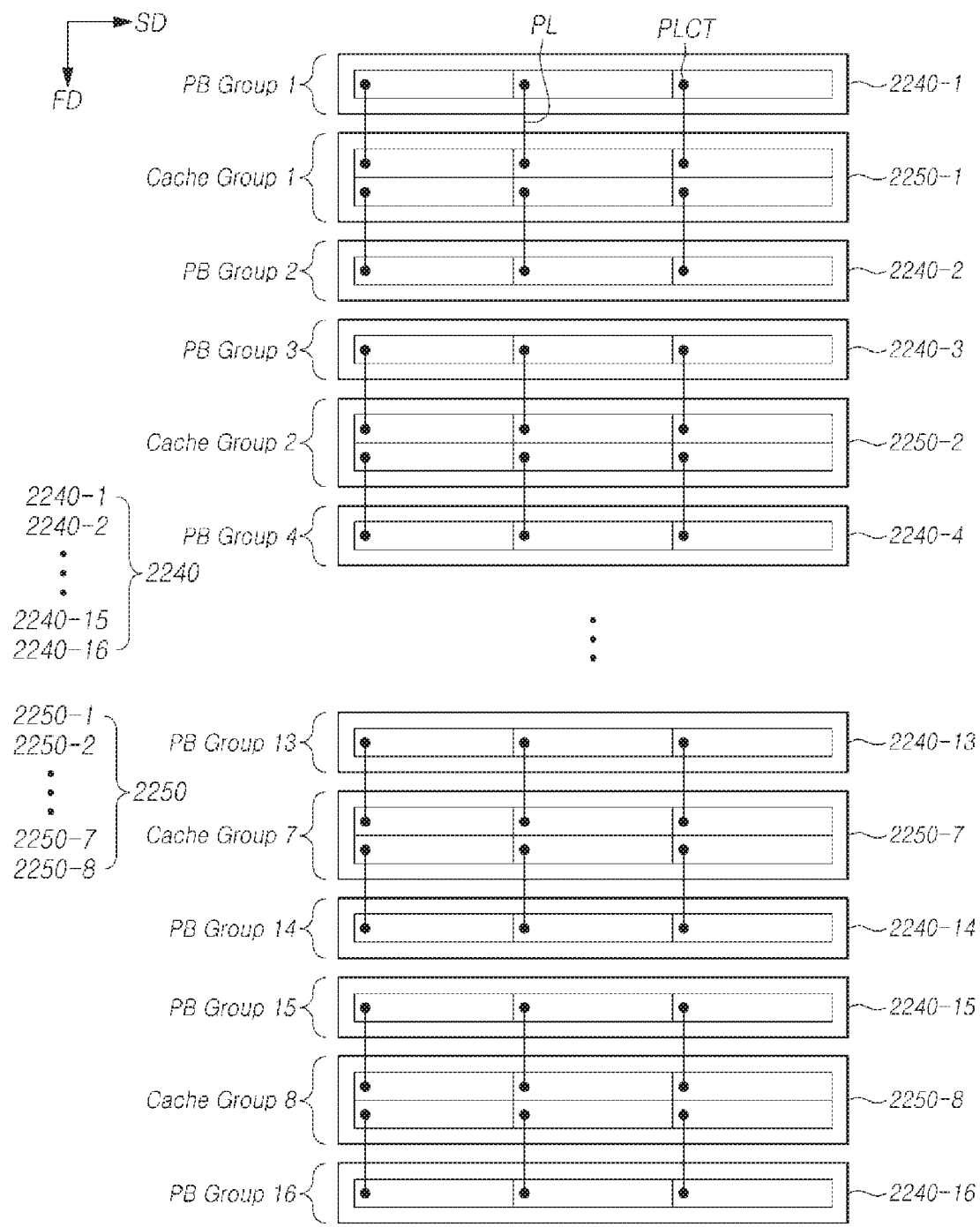
FIG. 22 is a diagram illustrating an example of the layout of page lines in the structure of FIG. 21.

FIG. 22 is a diagram illustrating an example of the layout of page lines PL in the structure of FIG. 21.

Referring to FIG. 22, each page buffer may be coupled with a corresponding cache by using a separate page line PL. For instance, the one page buffer belonging to each column of a first page buffer group 2240-1 may be coupled with one of the two caches belonging to each column of a first cache group 2250-1 through one page line PL. Even in the case of the page buffers belonging to the remaining page buffer groups 2240-2 to 2240-16, they may be coupled with corresponding caches through page lines PL in a manner similar thereto. A pair of a page line PL corresponding to the first page buffer group 2240-1 and a page line PL corresponding to the second page buffer group 2240-2 may be laid out on the same extending line at both sides of the first cache group 2250-1. Each pair of page lines PL corresponding to the remaining page buffer groups 2240-3 to 2240-16 may be laid out on the same extending line at both sides of each cache group, in a manner similar thereto.

The 16 page buffers configuring one data input/output unit may be laid out by being distributed in the 16 page buffer groups 2240-1 to 2240-16. For instance, the 16 page buffers laid out in the same columns of the 16 page buffer groups 2240-1 to 2240-16 may constitute the same data input/output unit. In this case, all of the 16 page lines PL corresponding to one data input/output unit may be laid out on one extending line. Therefore, a wiring area WA of page lines PL corresponding to one data input/output unit may be further reduced. Further, the length of each of page lines PL may be reduced to about 1/16 when compared to the comparative example of FIG. 9. The 16 page lines laid out on one extending line may be substantially the same in their lengths.

Figure 23:
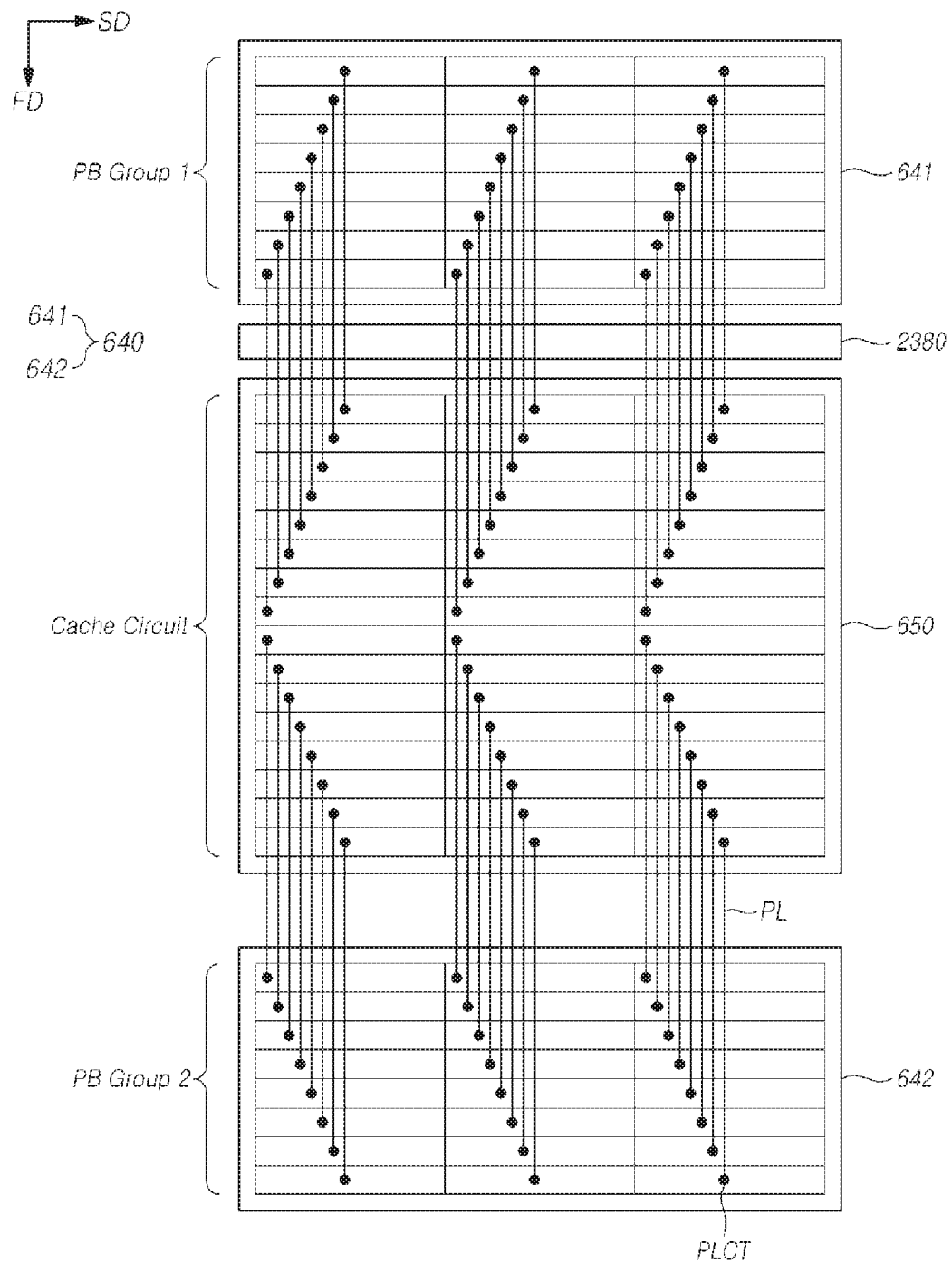
FIG. 23 is a block diagram illustrating an example of the structure of a page buffer circuit and a cache circuit in accordance with an embodiment.

FIG. 23 is a block diagram illustrating an example of the structure of a page buffer circuit and a cache circuit in accordance with an embodiment.

The embodiment of FIG. 23 is different from the embodiment of FIG. 6 in that a column decoder 2380 is disposed between the first page buffer group 641 and the cache circuit 650. Since the column select signal generated in the column decoder 2380 is provided to the cache circuit 650, it may be advantageous that the column decoder 2380 is disposed adjacent to the cache circuit 650. To this end, the column decoder 2380 may be disposed adjacent to the cache circuit 650. While it is illustrated in FIG. 23 that the column decoder 2380 is disposed between the first page buffer group 641 and the cache circuit 650, it is to be noted that the embodiment is not limited thereto. The column decoder 2380 may be disposed at a different position that is adjacent to the cache circuit 650. For example, the column decoder 2380 may be disposed between the second page buffer group 642 and the cache circuit 650 or at both sides of the cache circuit 650. In the above-described embodiments, when a cache circuit is divided into a plurality of cache groups, a column decoder may be divided accordingly and may be disposed adjacent to corresponding cache groups.

Figure 24:
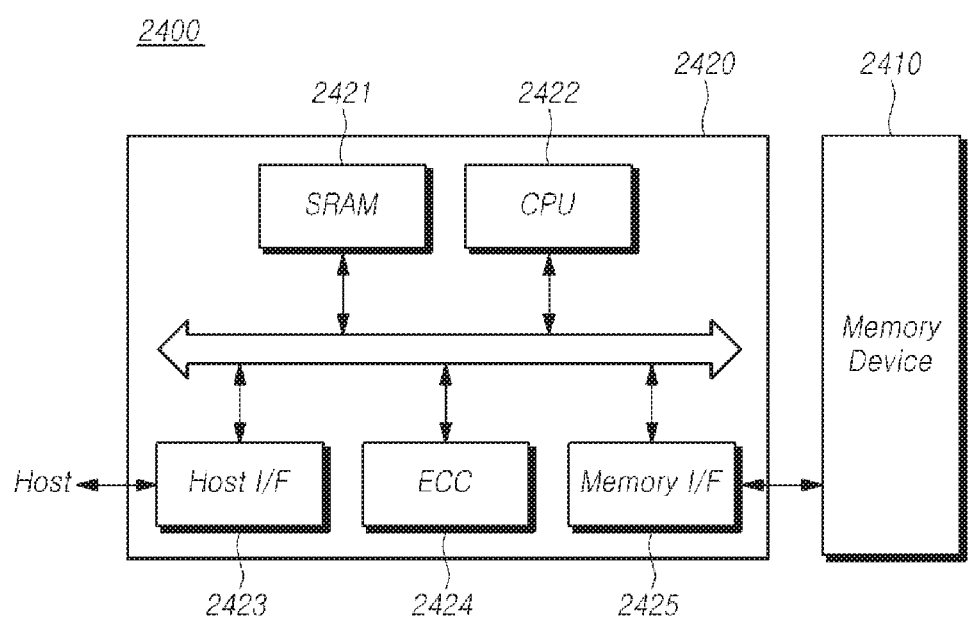
FIG. 24 is a simplified block diagram schematically illustrating a memory system including a memory device in accordance with an embodiment.

FIG. 24 is a simplified block diagram schematically illustrating a memory system including a memory device in accordance with an embodiment.

Referring to FIG. 24, a memory system 2400 may include a nonvolatile memory device 2410 and a memory controller 2420.

The nonvolatile memory device 2410 may be configured by the memory device described above and may operate in the manner described above. The memory controller 2420 may be configured to control the nonvolatile memory device 2410. By the combination of the nonvolatile memory device 2410 and the memory controller 2420, a memory card or a solid state disk (SSD) may be provided.

An SRAM 2421 may be used as the working memory of a processing unit (CPU) 2422. A host interface 2423 may include the data exchange protocol of a host which is coupled with the memory system 2400. An error correction block 2424 may detect and correct an error included in the data read from the nonvolatile memory device 2410. A memory interface 2425 may interface with the nonvolatile memory device 2410. The processing unit 2422 may perform general control operations for data exchange of the memory controller 2420.

Although not shown in the drawing, it is obvious to a person skilled in the art to which the embodiment pertains that the memory system 2400 may be additionally provided with a ROM which stores code data for interfacing with the host. The nonvolatile memory device 2410 may be provided as a multi-chip package which is configured by a plurality of flash memory chips.

The memory system 2400 in accordance with the embodiment, described above, may be provided as a storage medium of high reliability, which has a low probability of an error to occur. In particular, the aforementioned memory device may be provided for a memory system such as a solid state disk (SSD) which is being actively studied recently. In this case, the memory controller 2420 may be configured to communicate with an outside (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 25:
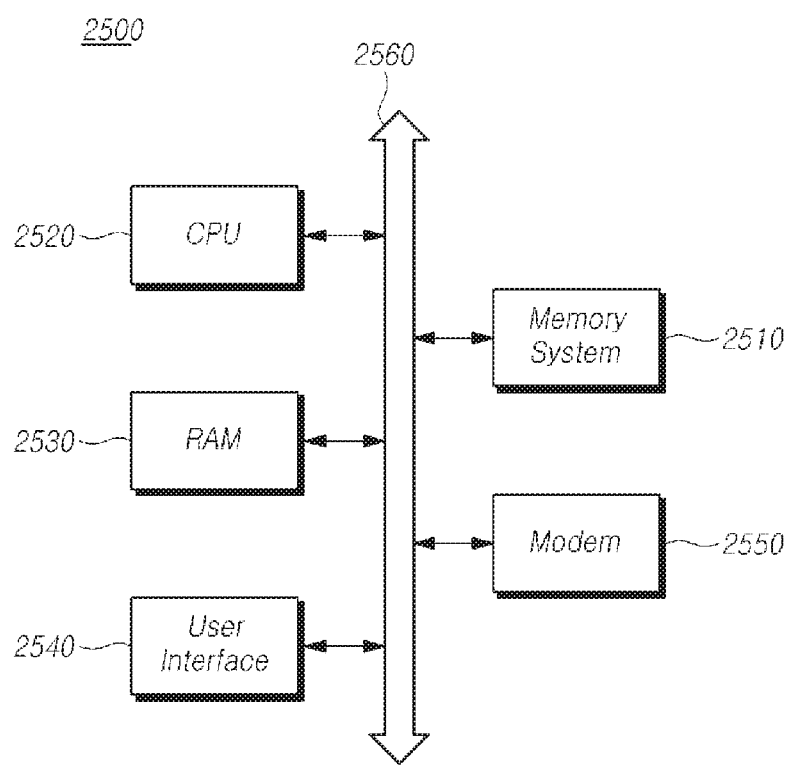
FIG. 25 is a simplified block diagram schematically illustrating a computing system including a memory device in accordance with an embodiment.

FIG. 25 is a simplified block diagram schematically illustrating a computing system including a memory device in accordance with an embodiment.

Referring to FIG. 25, a computing system 2500 may include a memory system 2510, a microprocessor 2520, a RAM 2530, a user interface 2540 and a modem 2550 such as a baseband chipset, which are electrically coupled to a system bus 2560. In the case where the computing system 2500 is a mobile device, a battery (not shown) for supplying the operating voltage of the computing system 2500 may be additionally provided. Although not shown in the drawing, it is obvious to a person skilled in the art to which the embodiment pertains that the computing system 2500 may be additionally provided with an application chipset, a camera image processor (CIS), a mobile DRAM, and so on. The memory system 2510 may configure, for example, an SSD (solid state drive/disk) which uses a nonvolatile memory to store data. Otherwise, the memory system 2510 may be provided as a fusion flash memory (for example, a one NAND flash memory).

In the description above, terms like "include," "comprise" and "have" should be interpreted in default as inclusive or open rather than exclusive or closed unless expressly defined to the contrary. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

While various embodiments have been described above, it will be understood to those skilled in the art that the embodiments described are by way of example only. Accordingly, the memory device described herein should not be limited based on the described embodiments.

What is claimed is:

1. A memory device comprising:
a plurality of bit lines extending in a first direction from a memory cell array to a page buffer circuit, and arranged in a second direction perpendicular to the first direction;
the page buffer circuit including a plurality of page buffers which are electrically coupled to the plurality of bit lines; and
a cache circuit including a plurality of caches which are electrically coupled to the plurality of page buffers,
wherein the page buffer circuit is divided into a plurality of page buffer regions which are physically separated and are disposed at both sides of the cache circuit in the first direction.

2. The memory device according to claim 1,
wherein the cache circuit is divided into at least two cache regions, and
wherein the page buffer regions are disposed at both sides of each of the cache regions in the first direction.

3. The memory device according to claim 2,
wherein the page buffer circuit is divided into page buffer regions the number of which is two times the number of the cache regions, and
wherein a pair of page buffer regions are respectively disposed at both sides of one cache region in the first direction.

4. The memory device according to claim 3, wherein the cache circuit is divided into two cache regions, and the page buffer circuit is divided into four page buffer regions.

5. The memory device according to claim 1,
wherein a page buffer respectively corresponds to a cache, and
wherein each page buffer is coupled with a corresponding cache through a separate page line.

6. The memory device according to claim 5,
wherein page buffers constituting one data input/output unit are laid out by being distributed in the plurality of page buffer regions, and
wherein each pair of a plurality of page lines which are coupled to page buffers constituting one data input/output unit and laid out by being distributed in the plurality of page buffer regions are laid out on the same extending line at both sides of the cache circuit.

7. The memory device according to claim 1,
wherein a page buffer respectively corresponds to a cache,
wherein page buffers constituting one data input/output unit are laid out by being distributed in the plurality of page buffer regions, and
wherein a plurality of page buffers constituting one data input/output unit in one page buffer region are coupled with corresponding caches through one page line.

8. The memory device according to claim 7, wherein a plurality of page lines which are coupled to page buffers constituting one data input/output unit and laid out by being distributed in the plurality of page buffer regions are laid out on the same extending line.

9. The memory device according to claim 1, wherein the page buffer circuit is divided into a plurality of page buffer regions based on corresponding data lines.

10. A memory device comprising:
a page buffer circuit including a plurality of page buffers; and
a cache circuit including a plurality of caches which correspond to the plurality of page buffers, respectively,
wherein each of the plurality of page buffers is coupled to a corresponding cache through a separate page line, and
wherein some of page lines which are coupled to page buffers constituting one data input/output unit are laid out at one side of the cache circuit, and the other some of the page lines are laid out at the other side of the cache circuit.

11. The memory device according to claim 10, wherein each pair of page lines which are coupled to page buffers constituting one data input/output unit are respectively laid out at both sides of the cache circuit on the same extending line.

12. The memory device according to claim 10, wherein even number of page lines are laid out on the same extending line among page lines which are coupled to page buffers constituting one data input/output unit.

13. The memory device according to claim 12, wherein page lines laid out on one extending line are at least four.

14. A memory device comprising:
a page buffer circuit including a plurality of page buffers; and
a cache circuit including a plurality of caches which correspond to the plurality of page buffers, respectively,
wherein page buffers constituting one data input/output unit are laid out by being distributed in a plurality of page buffer regions, and page buffers constituting one data input/output unit in each page buffer region are coupled to caches through one page line, and
wherein some of page lines which are coupled to the page buffers constituting one data input/output unit are laid out at one side of the cache circuit, and the other some of the page lines are laid out at the other side of the cache circuit.

15. The memory device according to claim 14, wherein all of page lines which are coupled to the page buffers constituting one data input/output unit are laid out on one extending line.

16. The memory device according to claim 15, wherein page lines laid out on one extending line are at least four.

17. The memory device according to claim 15, wherein page lines which are coupled to the page buffers constituting one data input/output unit are substantially the same in their lengths.

18. A memory device comprising:
a cache circuit including plurality of caches;
a plurality of bit lines extending in a first direction from a memory cell array to first and second page buffer groups, and arranged in a second direction perpendicular to the first direction,
wherein the first and second page buffer groups are physically separated and disposed at opposite sides of the cache circuit in the first direction and each of the first and second page buffer groups include page buffers respectively coupled to each half of the caches,
wherein the caches and the buffers are arranged in the first direction and are disposed opposite to each other in the first direction.

19. The memory device according to claim 18, further comprising a column decoder, wherein the column decoder is disposed adjacent to the cache circuit in the first direction.

* * * * *